United States Patent
Lim et al.

(10) Patent No.: US 8,648,383 B2
(45) Date of Patent: Feb. 11, 2014

(54) LIGHT EMITTING DEVICE AND LIGHT EMITTING DEVICE PACKAGE HAVING THE SAME

(71) Applicants: Woo Sik Lim, Gwangju (KR); Sung Ho Choo, Gwangju (KR); Byeong Kyun Choi, Siheung-si (KR)

(72) Inventors: Woo Sik Lim, Gwangju (KR); Sung Ho Choo, Gwangju (KR); Byeong Kyun Choi, Siheung-si (KR)

(73) Assignee: LG Innotek Co., Ltd., Seoul (KR)

(*) Notice: Subject to any disclaimer, the term of this patent is extended or adjusted under 35 U.S.C. 154(b) by 9 days.

(21) Appl. No.: 13/627,617

(22) Filed: Sep. 26, 2012

(65) Prior Publication Data
US 2013/0037848 A1 Feb. 14, 2013

Related U.S. Application Data

(63) Continuation of application No. 12/783,638, filed on May 20, 2010, now Pat. No. 8,283,692.

(30) Foreign Application Priority Data

May 21, 2009 (KR) .................. 10-2009-0044290

(51) Int. Cl.
*H01L 33/00* (2010.01)
(52) U.S. Cl.
USPC .................................. 257/99; 257/E33.066
(58) Field of Classification Search
None
See application file for complete search history.

(56) References Cited

U.S. PATENT DOCUMENTS

| | | | |
|---|---|---|---|
| 6,097,040 A | 8/2000 | Morimoto et al. | |
| 7,847,298 B2 | 12/2010 | Ogihara et al. | |
| 8,101,963 B2 | 1/2012 | Shakuda | |
| 8,283,692 B2 * | 10/2012 | Lim et al. ................ | 257/99 |
| 2005/0082547 A1 | 4/2005 | Chang et al. | |
| 2006/0124954 A1 | 6/2006 | Akaishi | |
| 2009/0256170 A1 | 10/2009 | Shakuda | |
| 2010/0032694 A1 | 2/2010 | Kim et al. | |
| 2010/0276722 A1 | 11/2010 | Baur et al. | |

FOREIGN PATENT DOCUMENTS

| | | |
|---|---|---|
| EP | 2 207 211 A1 | 7/2010 |
| JP | H 10-173224 | 6/1998 |
| KR | 10-2006-0069375 | 6/2006 |
| KR | 10-2006-0114920 | 11/2006 |
| TW | 200818550 A | 4/2008 |

OTHER PUBLICATIONS

European Search Report dated Dec. 17, 2013 for Application 10163208.1.

* cited by examiner

*Primary Examiner* — David Zarneke
(74) *Attorney, Agent, or Firm* — KED & Associates LLP

(57) ABSTRACT

Disclosed are a light emitting device and a light emitting device package having the same. The light emitting device includes a light emitting structure including a first conductive type semiconductor layer, an active layer, and a second conductive type semiconductor layer, a first electrode disposed in an opening portion of the light emitting structure and contacted with a portion of the first conductive type semiconductor layer, an insulating layer covering the first electrode, a second electrode disposed on the insulating layer and connected to the second conductive type semiconductor layer, a first electrode layer under the second electrode.

20 Claims, 17 Drawing Sheets

US 8,648,383 B2

LIGHT EMITTING DEVICE AND LIGHT EMITTING DEVICE PACKAGE HAVING THE SAME

This application is a Continuation of co-pending U.S. patent application Ser. No. 12/783,638 filed on May 20, 2010. The present application claims priority under 35 U.S.C. 119 to Korean Patent Application No. 10-2009-0044290 (filed on May 21, 2009), which is hereby incorporated by reference in its entirety.

BACKGROUND

The embodiment relates to a light emitting device and a light emitting device package having the same.

A III-V group nitride semiconductor has been variously used for an optical device such as blue/green LEDs (light emitting diodes), a high speed switching device such as a MOSFET (metal semiconductor field effect transistor) and a HEMT (hetero junction field effect transistor), alight source of an illumination or a display apparatus, and the like.

The nitride semiconductor is mainly used for the LED (Light Emitting Diode) or an LD (laser diode), and studies have been continuously conducted to improve the manufacturing process or a light efficiency of the nitride semiconductor.

SUMMARY

The embodiment provides a light emitting device having a stack structure of a first electrode, an insulating layer, and a second electrode on a first conductive type semiconductor layer, and a light emitting device package having the same.

The embodiment provides a light emitting device including a stack structure of a first electrode including an arm shape, an insulating layer, a second electrode, and a first electrode layer on the first conductive type semiconductor layer and a light emitting device package having the same.

The embodiment provides a light emitting device including a stack structure of a second electrode having an arm shape and a first electrode layer on a second conductive type semiconductor layer and a light emitting device package having the same.

The embodiment provides a light emitting device including a first electrode layer having a dual structure on a second conductive type semiconductor layer and a light emitting device package having the same.

The embodiment provides a light emitting device and a light emitting device package, in which first and second electrodes are offset from each other, or are vertically overlapped with each other.

The embodiment provides a light emitting device and a light emitting device package, in which the freedom degree for the first and second electrodes can be improved.

According to the embodiment, a light emitting device comprises a substrate; a light emitting structure on the substrate, the light emitting structure including a first conductive type semiconductor layer, an active layer on the first conductive type semiconductor layer, and a second conductive type semiconductor layer on the active layer; an opening portion disposed in the light emitting structure; a first electrode disposed in the opening portion and contacted with a portion of the first conductive type semiconductor layer; an insulating layer covering the first electrode; a second electrode on the insulating layer and connected to a portion of the second conductive type semiconductor layer; and a first electrode layer between the second electrode and the second conductive type semiconductor layer.

According to the embodiment, a substrate; a light emitting structure on the substrate, the light emitting structure including a first conductive type semiconductor layer, an active layer on the first conductive type semiconductor layer, and a second conductive type semiconductor layer on the active layer; an opening portion disposed in the light emitting structure; a first electrode disposed in the opening area and contacted with a portion of the first conductive type semiconductor layer; an insulating layer covering the first electrode; a second electrode on the insulating layer and connected to the second conductive type semiconductor layer; and a first electrode layer including a reflective electrode layer between the second electrode and the second conductive type semiconductor layer.

According to the embodiment, a light emitting device package includes a body, a plurality of lead electrodes disposed on the body, a light emitting device electrically connected to the lead electrodes, and a molding member covering the light emitting device. The light emitting device includes a substrate; a light emitting structure on the substrate, the light emitting structure including a first conductive type semiconductor layer, an active layer on the first conductive type semiconductor layer, and a second conductive type semiconductor layer on the active layer; an opening portion disposed in the light emitting structure; a first electrode disposed in the opening portion and contacted with a portion of the first conductive type semiconductor layer; an insulating layer covering the first electrode; a second electrode on the insulating layer and connected to a portion of the second conductive type semiconductor layer; and a first electrode layer between the second electrode and the second conductive type semiconductor layer.

DETAILED DESCRIPTION OF THE EMBODIMENTS

Hereinafter, the embodiment will be described with reference to accompanying drawings.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

Figure 1:
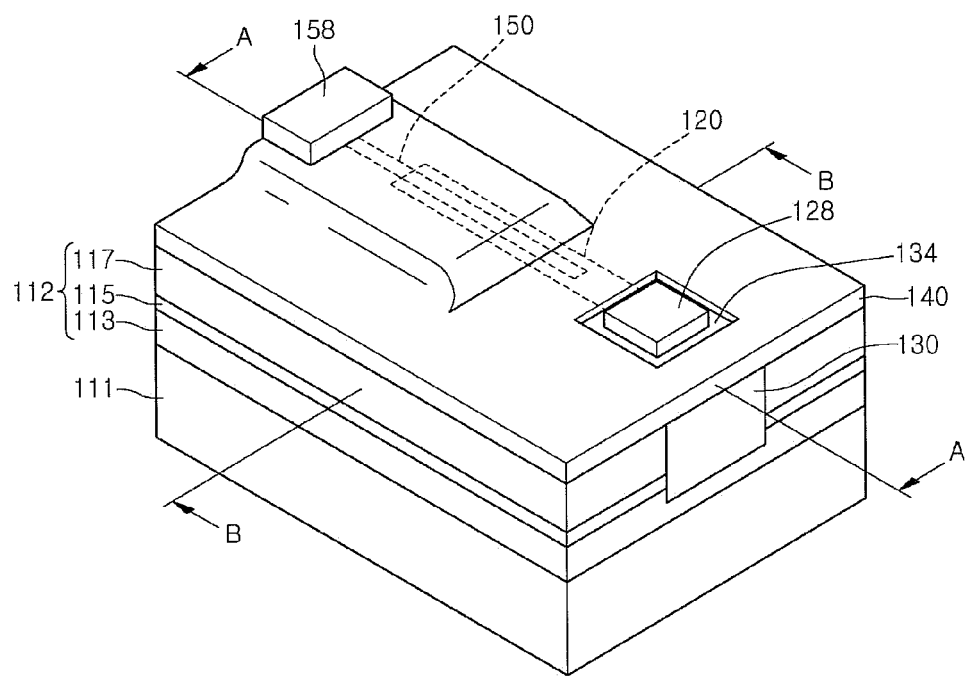
FIG. 1 is a perspective view showing a light emitting device according to a first embodiment.
Figure 2:
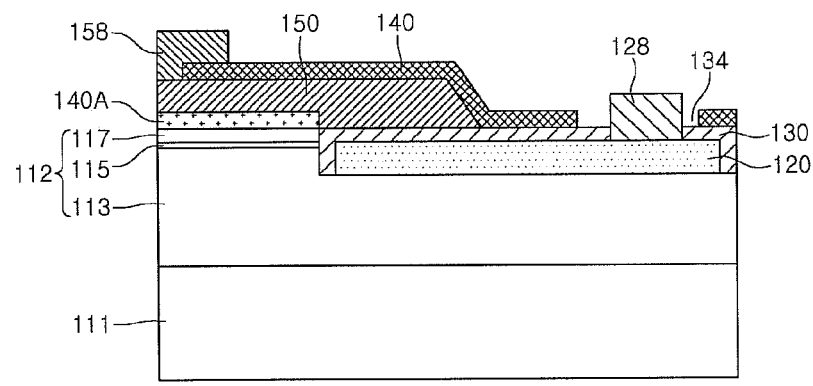
FIG. 2 is a sectional view taken along line A-A of FIG. 1.
Figure 3:
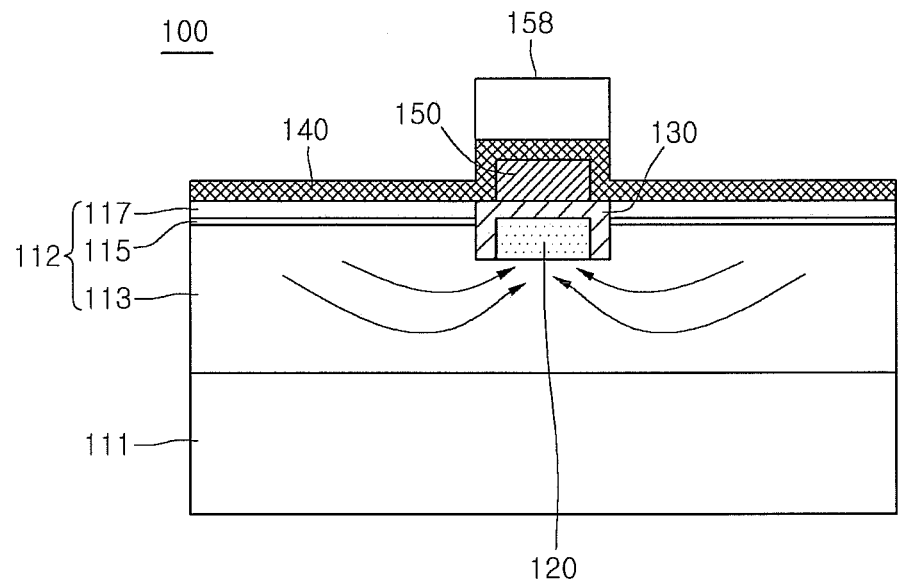
FIG. 3 is a side sectional view of line B-B of FIG. 1.

FIG. 1 is a perspective view showing a light emitting device according to a first embodiment, FIG. 2 is a sectional view taken along line A-A of FIG. 1, and FIG. 3 is a side sectional view of line B-B of FIG. 1.

Referring to FIG. 1, a light emitting device 100 includes a substrate 111, a first conductive type semiconductor layer 113, an active layer 115, a second conductive type semiconductor layer 117, a first electrode 120, a first pad 128, an insulating layer 130, a second electrode 150, a first electrode layer 140, a second pad 158, and a second electrode layer 140A.

The substrate 111 may include at least one of Al2O3, SiC, Si, GaAs, GaN, ZnO, GaP, InP, and Ge. The substrate 111, and may serve as a conductive substrate. A concave-convex pattern may be formed on and/or under the substrate 111. The concave-convex pattern may include one of a stripe shape, a lens shape, a column shape, and a conical shape.

A buffer layer and/or an undoped semiconductor layer may be formed on the substrate 111. The buffer layer may reduce lattice mismatching between a GaN material and a substrate material, and may include at least one of GaN, InN, AlN, InGaN, AlGaN, InAlGaN, or AlInN. The undoped semiconductor layer may be formed on the substrate 111 or the buffer layer, and may include an undoped GaN-based material. The buffer layer and/or the undoped semiconductor layer may include various materials and may be formed in various ways.

The first conductive type semiconductor layer 113 is formed on the substrate 111, and the first conductive type semiconductor layer 113 includes at least one semiconductor layer doped with first conductive dopants, and includes a first electrode contact layer. When the first conductive type semiconductor layer 113 is a N-type semiconductor layer, the first conductive type semiconductor layer 113 may include at least one of GaN, InN, AlN, InGaN, AlGaN, InAlGaN, AlInN, AlGaAs, GaP, GaAs, GaAsP, or AlGaInP. The first conductive type semiconductor layer 113 may include a single layer or multiple layers. When the first conductive dopant is an N-type dopant, the first conductive type semiconductor layer 113 may include Si, Ge, Sn, Se, or Te.

The active layer 115 is formed on the first conductive type semiconductor layer 113. The active layer 115 may include III-V group compound semiconductors. The active layer 115 may include at least one of a signal quantum well structure, a multiple quantum well structure, a quantum wire structure, or a quantum dot structure. A well layer/barrier layer of the active layer 115 may include a pair structure of InGaN/GaN, GaN/AlGaN, or InGaN/InGaN, but the embodiment is not limited thereto. The well layer may include a material having a band gap lower than that of the barrier layer.

A first conductive clad layer may be provided below the active layer 115. The first conductive clad layer may include an AlGa-based semiconductor, and has a band gap higher than that of the active layer 115.

The active layer 115 is made from material having band gap energy according to wavelength of light to be emitted. For instance, in the case of blue light having wavelength of 460 to 470 nm, the active layer 115 has a single quantum well structure or a multiple quantum well structure including the InGaN well/GaN barrier layers. The active layer 115 may selectively include material capable of providing light of visible ray band, such as blue light, red light and green light, and the material can be changed within the technical scope of the embodiment.

A first conductive clad layer may be formed between the first conductive type semiconductor layer 113 and the active layer 115. If the first conductive clad layer is an N-type semiconductor layer, the first conductive clad layer may include an N-type AlGaN layer, but the embodiment is not limited thereto. The first conductive clad layer has a band gap higher than that of the active layer 115.

The second conductive type semiconductor layer 117 includes at least one semiconductor layer doped with a second conductive dopant, and includes a second contact layer. When the second conductive type semiconductor layer 117 is a P-type semiconductor layer, the second conductive type semiconductor layer 117 may include at least one of GaN, InN, AlN, InGaN, AlGaN, InAlGaN, AlInN, AlGaAs, GaP, GaAs, GaAsP, or AlGaInP. The second conductive type semiconductor layer 117 may include a single layer or multiple layers. When the second conductive dopant is a P-type dopant, the second conductive type semiconductor layer 117 may include at least one of Mg, Zn, Ca, Sr, or Ba.

A third conductive type semiconductor layer (not shown) may be formed on the second conductive type semiconductor layer 117. The third conductive type semiconductor layer may include a semiconductor layer having a polarity opposite to that of the second conductive type. For example, the third conductive type semiconductor layer may include at least one of GaN, InN, AlN, InGaN, AlGaN, InAlGaN, AlInN, AlGaAs, GaP, GaAs, GaAsP, or AlGaInP. The third conductive type semiconductor layer may include a single layer or multiple layers. When the third conductive type semiconductor layer is an N-type semiconductor layer, the third conductive type semiconductor layer may include at least one of GaN, InN, AlN, InGaN, AlGaN, InAlGaN, or AlInN. When the first conductive dopant is an N-type dopant, the third conductive type semiconductor layer may include Si, Ge, Sn, Se, or Te.

A light emitting structure 112 includes the first conductive type semiconductor layer 113, the active layer 115, and the second conductive type semiconductor layer 117. The light emitting structure 112 may further include the third conductive type semiconductor layer, which has a polarity opposite to that of the second conductive type, formed on the second conductive type semiconductor layer 117. In addition, the first conductive type semiconductor layer 113 may include a P-type semiconductor layer, and the second conductive type semiconductor layer 117 may include an N-type semiconductor layer. The light emitting structure 112 may include one of an N-P junction structure, a P-N junction structure, an N-P-N junction structure, and a P-N-P junction structure. Hereinafter, a case in which the second conductive type semiconductor layer 117 is provided at the uppermost layer of the light emitting structure 112 will be described.

The first electrode 120 is formed on the first conductive type semiconductor layer 113, and the insulating layer 130 is formed on the first electrode 120. An opening 134 is formed at a portion of the insulating layer 130. In the opening 134, the first electrode 120 is exposed, and the first pad 128 may be formed. The first pad 128 may not be formed. In this case, the first electrode serves as the first pad.

The first electrode 120 and the first pad 128 may include at least one layer including at least one mixture or a plurality of mixture materials of Ti, Al, In, Ta, Pd, Co, Ni, Si, Ge, Ag, Rh, Au, Ir, Pt, W or Au, but the embodiment is not limited to the materials.

The first electrode 120 may include at least one of a straight-line pattern, a curved pattern, a mixture pattern of the straight-line pattern and the curved pattern, plural patterns branching from one pattern, a polygonal shape pattern, a lattice shape pattern, a dot shape pattern, a diamond shape pattern, a parallelogram shape pattern, a mesh shape pattern, a stripe shape pattern, a cross shape pattern, a star-shape pattern, a circular shape pattern, or a mixture pattern thereof, but the embodiment is not limited thereto. The first electrode 120 having the pattern can supply uniform power to the first conductive type semiconductor layer 113, thereby preventing current from being concentrated on one place.

The first pad 128 is formed on a portion of the first electrode 120. One first pad or a plurality of pads may be provided.

The first pad 128 may be provided at a position to smoothly transfer power to the first electrode 120. For example, the first pad 128 may be provided at a central portion or an edge portion of the first electrode 120. The active layer 115 and the second conductive type semiconductor layer 117 may not be formed on the first electrode 120.

The insulating layer 130 is formed at a peripheral portion of the first electrode 120, and prevents the first electrode 120 from making contact with another semiconductor layer such as the active layer 115 or the second conductive type semiconductor layer 117. The first electrode 120 is embedded in the light emitting structure 112. In addition, the first electrode 120 and the insulating layer 130 are embedded in the light emitting structure 112.

The first pad 128 may be formed on the first electrode 120. The insulating layer 130 may include SiO2, Si3N4, Al2O3, or TiO2, but the embodiment is not limited thereto.

The second electrode layer 140A is formed on the second conductive type semiconductor layer 117 or the third conductive type semiconductor layer. The second electrode 150 is formed on the second electrode layer 140A and the insulating layer 130. The first electrode layer 140 is formed on the second electrode 150, the second conductive type semiconductor layer 117, and the insulating layer 130.

The first electrode layer 140 is vertically overlapped with the first electrode 120 on the insulating layer 130. The second electrode 150 is vertically overlapped with the first electrode 120 on the insulating layer 130. The insulating layer 130, the second electrode 150, and a portion of the second electrode layer 140A are vertically overlapped with each other on the first electrode 120.

The second electrode layer 140A may be locally formed between the second electrode 150 and the second conductive type semiconductor layer 117 or may be formed on the entire top surface of the second conductive type semiconductor layer 117.

The second electrode layer 140A may contacts with the second conductive type semiconductor layer 117 to enhance the adhesive strength with the second conductive type semiconductor layer 117 and improve conductivity with the second conductive type semiconductor layer 117. When the second electrode layer 140A is formed on the entire top surface of the second conductive type semiconductor layer 117, the second electrode layer 140A can diffuse current with the first electrode layer 140.

The second electrode layer 140A and the first electrode layer 140 may include a transmittive electrode material and/or a reflective electrode material. The electrode material may include at least one of a transmittive electrode layer, a reflective electrode layer, and an electrode structure. The transmittive electrode layer may include an insulating material or a conductive material selectively including one oxide and a nitride. The transmittive electrode layer may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), ZnO, IrOx, RuOx, NiO, TiOx, and SnO2, but the embodiment is not limited thereto. The first electrode layer 140 is provided in the form of a thin film including metal such as Au or Al so that light can be transmitted. The reflective electrode material forms a reflective electrode layer, and may include Ag, Ni, Al, Rh, Pd, Ir, Ru, Mg, Zn, Pt, Au, Hf, or the combination thereof.

At least one of the second electrode layer 140A and the first electrode layer 140 may include a reflective layer including Al, Ag, Pd, Rh, or Pt. In this case, when a chip is mounted through a flip scheme, reflective efficiency can be improved.

A portion of the second electrode 150 has an arm shape or a branch structure, and is formed on the second electrode layer 140A and the insulating layer 130. The second electrode 150 may be connected with the second conductive type semiconductor layer 117 through the second electrode layer 140A.

The second electrode 150 may include at least one of a straight-line pattern, a curved pattern, a mixture pattern of the straight-line pattern and the curved pattern, plural patterns branching from one pattern, a polygonal shape pattern, a lattice shape pattern, a dot shape pattern, a diamond shape pattern, a parallelogram shape pattern, a mesh shape pattern, a stripe shape pattern, a cross shape pattern, a star-shape pattern, a circular shape pattern, and a mixture pattern thereof, but the embodiment is not limited thereto. The second electrode 150 having the pattern can supply uniform power to the second conductive type semiconductor layer 117 through the second electrode layer 140A and the first electrode layer 140, thereby preventing current from being concentrated on one place.

The second electrode layer 140A is formed on the second conductive type semiconductor layer 117, and a portion of the first electrode layer 140 can directly make contact with the top surface of the second electrode layer 140A. The first electrode layer 140 and the second electrode layer 140A may have a dual current diffusion structure.

Since the first electrode layer 140 may occupy the most part of the top surface of a chip, current diffusion can be improved.

The first pad 128 may be formed on the first electrode 120 through the opening 134 of the first electrode layer 140. The second pad 158 may be formed on the second electrode 150, and a portion of the second pad 158 is formed on the first electrode layer 140, and is vertically overlapped with the second electrode 150.

One second pad 158 or a plurality of pads 158 may be provided. The second pad 158 and the second electrode 150 may include at least one layer including at least one of Ag, Ag alloy, Ni, Al, Al alloy, Rh, Pd, Ir, Ru, Mg, Zn, Pt, Au, and Hf or the mixture thereof, but the embodiment is not limited thereto.

According to the second embodiment, the first electrode layer 140 is provided on the second electrode 150, thereby preventing the second electrode 150 from being peeled. In addition, a stack structure of the first electrode 120/the insulating layer 130/the second electrode 150/the first electrode layer 140 is provided, so that the first electrode 120 and a portion of the second electrode 150 can be vertically overlapped with each other. The light emitting device 100 prevents a light emitting area from being reduced, thereby improving external quantum efficiency.

As shown in FIGS. 2 and 3, current can be uniformly diffused and supplied through the first electrode 120, the second electrode 150, the second electrode layer 140A, and the first electrode layer 140, so that current efficiency can be improved.

FIGS. 4 to 12 are views showing the manufacturing process of the light emitting device according to the first embodiment.

Figure 4:
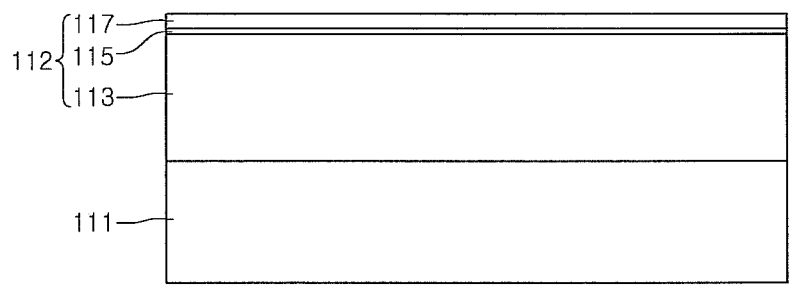
FIGS. 4 to 12 are view showing the manufacturing process of the light emitting device according to the first embodiment.

Referring to FIG. 4, a plurality of compound semiconductor layers may be formed on the substrate 111. The compound semiconductor layers include the light emitting structure 112. The light emitting structure 112 includes the first conductive type semiconductor layer 113, the active layer 115, and the second conductive type semiconductor layer 117 sequentially. The substrate 111 may include at least one of $Al_2O_3$, SiC, Si, GaAs, GaN, ZnO, GaP, InP, and Ge. A concave-convex structure may be formed on the substrate 111.

A compound semiconductor layer is grown on the substrate 111. The compound semiconductor layer may be grown by an electronic beam depositor, physical vapor deposition (PVD), chemical vapor deposition (CVD), plasma laser deposition (PLD), a dual-type thermal evaporator, sputtering, or metal organic chemical vapor deposition (MOCVD), but the embodiment is not limited thereto. The compound semiconductor layer has a composition equation of $In_xAl_yGa_{1-x-y}N$ ($0 \leq x \leq 1$, $0 \leq y \leq 1$, $0 \leq x+y \leq 1$).

A buffer layer and/or an undoped semiconductor layer may be formed on the substrate 111. The buffer layer can reduce lattice mismatch between a GaN material and a substrate material. The buffer layer may include at least one of II-VI group compound semiconductors such as GaN, InN, AlN, InGaN, AlGaN, InAlGaN, AlInN, AlGaAs, GaP, GaAs, GaAsP, or AlGaInP. The undoped semiconductor layer may be formed on the substrate 111 or the buffer layer, and may include an undoped GaN layer. The undoped semiconductor layer serves as a substrate on which a nitride semiconductor is grown.

The first conductive type semiconductor layer 113 is formed on the substrate 111, and the first conductive type semiconductor layer 113 includes at least one semiconductor layer doped with first conductive dopants, and includes a first electrode contact layer. When the first conductive type semiconductor layer 113 is a N-type semiconductor layer, the first conductive type semiconductor layer 113 may include at least one of GaN, InN, AlN, InGaN, AlGaN, InAlGaN, AlInN, AlGaAs, GaP, GaAs, GaAsP, or AlGaInP. When the first conductive dopant is an N-type dopant, the first conductive type semiconductor layer 113 may include Si, Ge, Sn, Se, or Te.

The active layer 115 is formed on the first conductive type semiconductor layer 113. The active layer 115 may include III-V group compound semiconductors. The active layer 115 may include at least one of a signal quantum well structure, a multiple quantum well structure, a quantum wire structure, and a quantum dot structure. A well layer/barrier layer of the active layer 115 may include a pair structure of InGaN/GaN, GaN/AlGaN, or InGaN/InGaN, but the embodiment is not limited thereto. The well layer may include a material having a band gap lower than that of the barrier layer.

The first conductive clad layer may be provided below the active layer 115. A second conductive clad layer may be provided below the active layer 115. The first and second conductive clad layers may include a GaN-based semiconductor and have a band gap higher than a band gap of the active layer 115.

The active layer 115 may include a material emitting color light such as blue, red, or green light, and the material can be changed within the technical scope of the embodiment.

The second conductive type semiconductor layer 117 includes at least one semiconductor layer doped with second conductive dopants and includes a second electrode contact layer. When the second conductive type semiconductor layer 117 is a P-type semiconductor layer, the second conductive type semiconductor layer 117 may include at least one of GaN, InN, AlN, InGaN, AlGaN, InAlGaN, AlInN, AlGaAs, GaP, GaAs, GaAsP, or AlGaInP. When the second conductive dopant is a P-type dopant, the second conductive type semiconductor layer 117 may include at least one of Mg, Zn, Ca, Sr, and Ba.

The third conductive type semiconductor layer (not shown) may be formed on the second conductive type semiconductor layer 117, and may include a semiconductor layer having a polarity opposite to that of the second conductive type.

The light emitting structure 112 includes the first conductive type semiconductor layer 113, the active layer 115, and the second conductive type semiconductor layer 117. The light emitting structure 112 may further include the third conductive type semiconductor layer on the second conductive type semiconductor layer 117. In addition, the first conductive type semiconductor layer 113 may include a P-type semiconductor layer, and the second conductive type semiconductor layer 117 may include an N-type semiconductor layer. The light emitting structure 112 may include one of an N-P junction structure, a P-N junction structure, an N-P-N junction structure, and a P-N-P junction structure.

Figure 5:
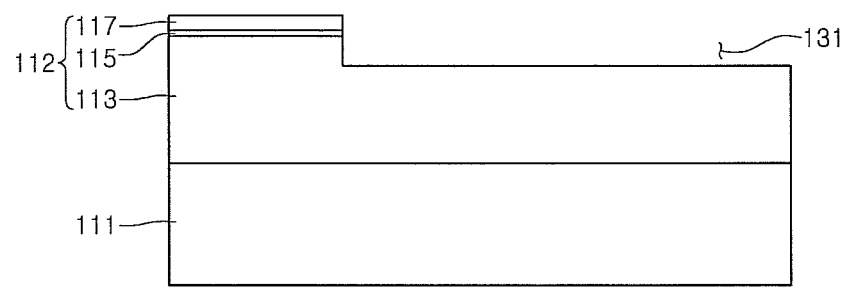
Figure 6:
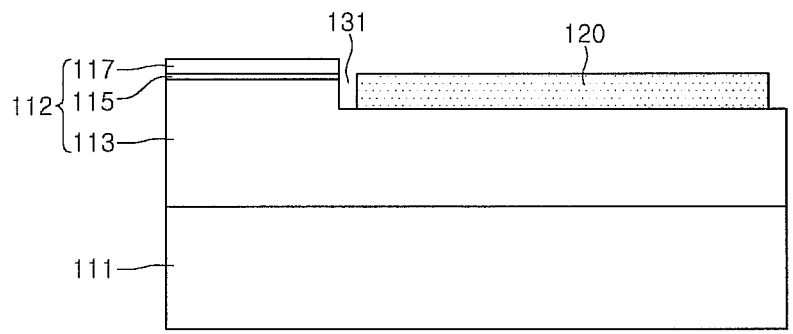

Referring to FIGS. 5 and 6, a portion of the first conductive type semiconductor layer 113 is exposed through an etching process. The exposed region of the first conductive type semiconductor layer 113 serves as a first electrode groove 131, and has a structure corresponding to the first electrode pattern.

The first electrode 120 is formed on the first conductive type semiconductor layer 113 exposed in the first electrode groove 131. The first electrode 120 is spaced apart from the active layer 115 and the second conductive type semiconductor layer 117. In this case, the first electrode 120 may be formed after protecting an outer portion of the active layer 115 and the second conductive type semiconductor layer 117 by using a mask pattern or an insulating layer. The first electrode 120 is embedded in the first conductive type semiconductor layer 113, the active layer 115, and the second conductive type semiconductor layer 117.

The first electrode 120 may include at least one layer including at least one of Ti, Al, In, Ta, Pd, Co, Ni, Si, Ge, Ag, Rh, Au, Ir, Pt, W and Au or the mixture thereof, but the embodiment is not limited thereto.

The first electrode 120 may include at least one of a straight-line pattern, a curved pattern, a mixture pattern of the straight-line pattern and the curved pattern, plural patterns branching from one pattern, a polygonal shape pattern, a lattice shape pattern, a dot shape pattern, a diamond shape pattern, a parallelogram shape pattern, a mesh shape pattern, a stripe shape pattern, a cross shape pattern, a star-shape pattern, a circular shape pattern, and a mixture pattern thereof, but the embodiment is not limited thereto. The first electrode 120 having the pattern can supply uniform power to the first conductive type semiconductor layer 113, thereby preventing current from being concentrated on one place.

Figure 7:
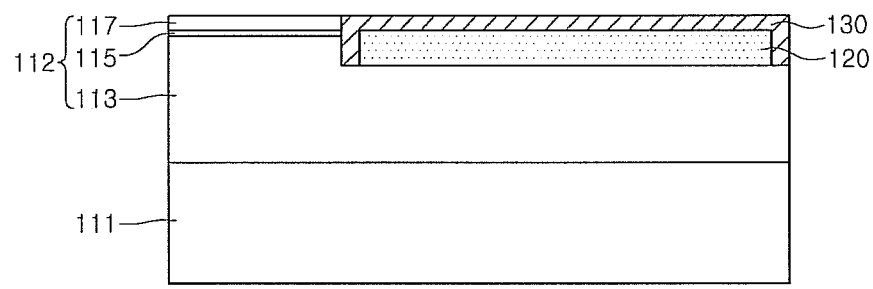

Referring to FIGS. 6 and 7, the insulating layer 130 covers the first electrode 120. The insulating layer 130 surrounds the first electrode 120, and insulates the first electrode 120 from the active layer 115 and the second conductive type semiconductor layer 117. The insulating layer 130 may include $SiO_2$, $Si_3N_4$, $Al_2O_3$, or $TiO_2$, but the embodiment is not limited thereto. The first electrode 120 and the insulating layer 130 may be embedded in the light emitting structure 112.

A top surface of the insulating layer 130 may be aligned in a line with a top surface of the second conductive type semiconductor layer 117 or not, but the embodiment is not limited thereto. A portion of the insulating layer 130 may extend beyond the second conductive type semiconductor layer 117.

Figure 8:
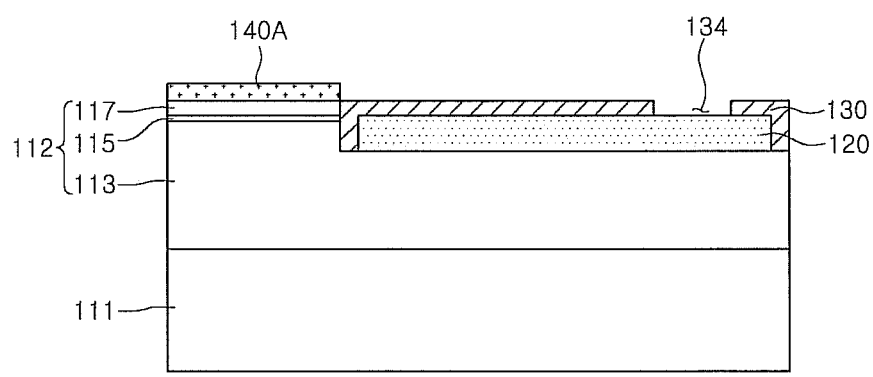
Figure 9:
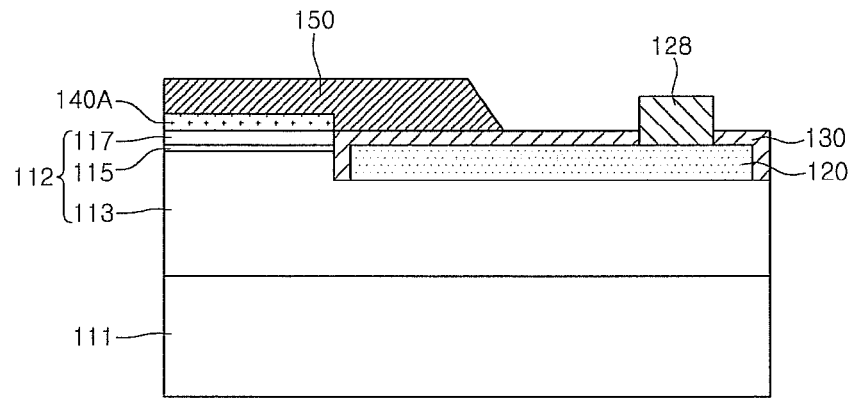

Referring to FIGS. 8 and 9, the opening 134 may be formed in the insulating layer 130. The opening 134 may be formed when the insulating layer 130 is formed or after the insulating layer 130 has been formed.

The second electrode 140A is formed on a local region or an entire region of the second conductive type semiconductor layer 117. The second electrode 140A includes a transmittive electrode layer or a reflective electrode layer. The transmittive electrode may include at least one of ITO, IZO, IZTO, IAZO, IGZO, IGTO, AZO, ATO, GZO), IZON, ZnO, IrOx, RuOx, NiO, TiOx, and $SnO_2$, but the embodiment is not limited thereto. The second electrode layer 140A is provided in the form of a thin film including metal such as Au or Al so that light can be transmitted. The reflective material is used to form a reflective electrode layer, and may include Ag, Ni, Al, Rh, Pd, Ir, Ru, Mg, Zn, Pt, Au, Hf, or the selective combination thereof.

The second electrode layer 140A may include a reflective electrode layer including Al, Ag, Pd, Rh, or Pt. When a chip is mounted through a flip scheme, reflective efficiency can be improved.

The second electrode layer 140A may be locally formed at a second electrode region on the top surface of the second conductive type semiconductor layer 117, or may be formed on the entire top surface of the second conductive type semiconductor layer 117.

Figure 10:
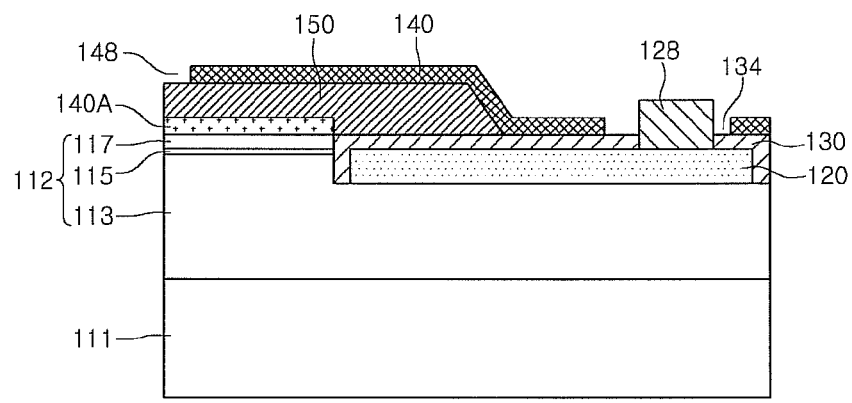

Referring to FIGS. 9 and 10, the second electrode 150 is formed on the second electrode layer 140A and the insulating layer 130. The first pad 128 may be formed on the first electrode 120. The first pad 128 may selectively include materials of the first electrode 120, but the embodiment is not limited thereto.

The second electrode 150 may include at least one layer including at least one of Ag, Ag alloy, Ni, Al, Al alloy, Rh, Pd, Ir, Ru, Mg, Zn, Pt, Au, and Hf or the mixture thereof, but the embodiment is not limited thereto.

The second electrode layer 140A may directly contacts with the second conductive type semiconductor layer 117 to improve current flow in the entire portion of the second conductive type semiconductor layer 117.

The first electrode layer 140 is formed on the second electrode 150, the insulating layer 130, the second conductive type semiconductor layer 117, or the second electrode layer 140A. The first electrode layer 140 may be formed except for the opening 134 or 148. A portion of the insulating layer 130 may be exposed through the opening 134. In addition, the first electrode 120 and the second electrode 150 may be partially exposed.

The first electrode layer 140 may selectively include materials of the second electrode layer 140A. For example, the first electrode layer 140 includes a transmittive electrode material or a reflective electrode material. The first electrode layer 140 includes a transmittive electrode layer or a reflective electrode layer. The transmittive electrode layer may include at least one of ITO, IZO, IZTO, IAZO, IGZO, IGTO, AZO, ATO, GZO, IZON, ZnO, IrOx, RuOx, NiO, TiOx, or $SnO_2$, but the embodiment is not limited thereto. The first electrode layer 140 is provided in the form of a thin film including metal such as Au or Al so that light can be transmitted. The reflective electrode material includes a reflective electrode layer, and may include Ag, Ni, Al, Rh, Pd, Ir, Ru, Mg, Zn, Pt, Au, and Hf, or the selective combination thereof.

Figure 11:
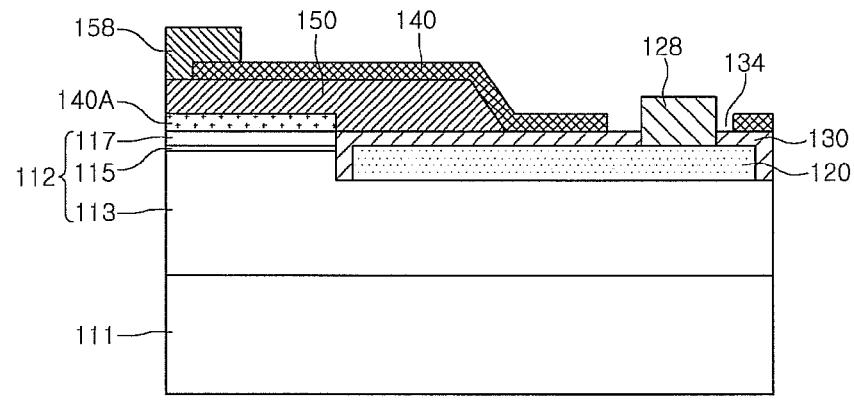

Referring to FIGS. 10 and 11, a second pad 158 is formed on the second electrode 150 exposed through the opening 148. A portion of the second pad 158 can extend beyond the first electrode layer 140.

The first pad 128 may be formed before or after the first electrode layer 140 is formed. The first pad 128 and/or the second pad 158 may not be formed. The second pad 158 may selectively include the materials of the second electrode 158.

Figure 12:
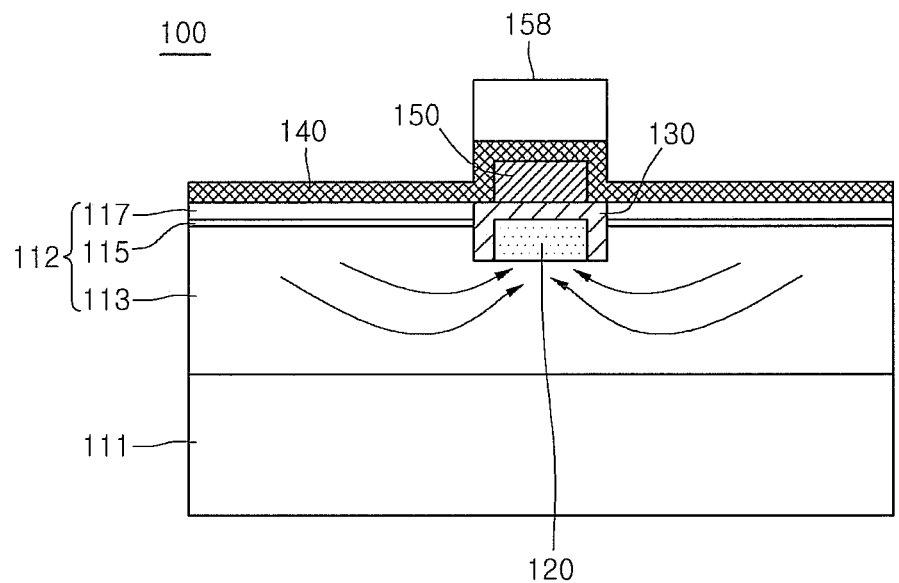

FIG. 12 is side sectional view taken along line B-B of FIG. 1.

Referring to FIGS. 11 and 12, in the light emitting device 100, the first electrode layer 140 is provided on the second electrode 150, thereby preventing the second electrode 150 from being peeled. The stack structure of the first electrode 120/the insulating layer 130/the second electrode 150/the first electrode layer 140 is formed on the first conductive type semiconductor layer 113, so that the first electrode 120 and a portion of the second electrode 150 can be vertically overlapped with each other. In this case, in the light emitting device 100, a light emitting area can be improved, and external quantum efficiency can be improved.

The second electrode 150 may be formed only on the insulating layer 130, and the structure can improve luminous intensity. Current is diffused through the first electrode 120, the second electrode 150, the second electrode layer 140A, and the first electrode layer 140 and supplied, so that current efficiency can be improved.

Figure 13:
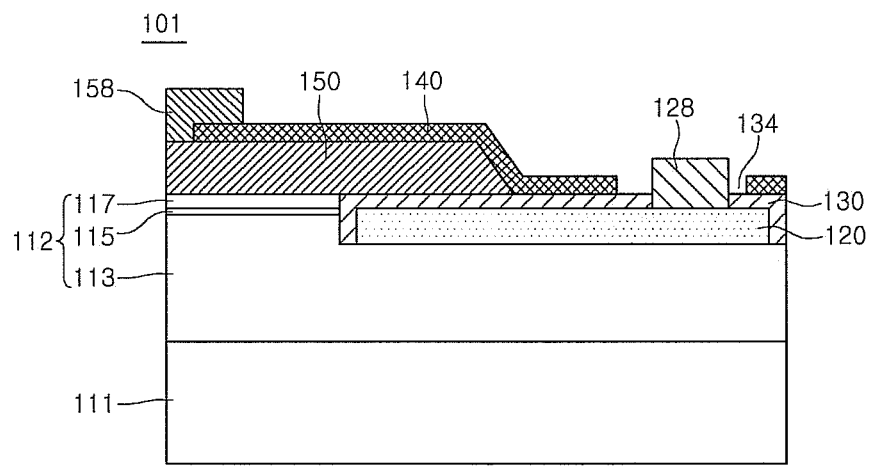
FIG. 13 is a side sectional view showing a light emitting device according to a second embodiment.

FIG. 13 is a side sectional view showing a light emitting device 101 according to the second embodiment. Hereinafter, the second embodiment will be described while focusing on the difference between the first embodiment and the second embodiment in order to avoid redundancy.

Referring to FIG. 13, the light emitting device 101 includes the substrate 111, the first conductive type semiconductor layer 113, the active layer 115, the second conductive type semiconductor layer 117, the first electrode 120, the first pad 128, the insulating layer 130, the second electrode 150, the first electrode layer 140, and the second pad 158.

The second electrode 150 is formed on the second conductive type semiconductor layer 117, and the second electrode 150 is provided on the second conductive type semiconductor layer 117 and the insulating layer 130. The second embodiment has a structure in which the second electrode layer (see 140A of FIG. 2) is removed from the first embodiment. The second electrode 150 may directly make contact with the second conductive type semiconductor layer 117 on the second conductive type semiconductor layer 117.

A portion of the second electrode 150 is formed on the second conductive type semiconductor layer 117, and other portion of the second electrode 150 is provided on the insulating layer 130, so that the peeled area of the second electrode 150 can be reduced.

A portion or an entire portion of the second electrode 150 is formed on the insulating layer 130, and the first electrode layer 140 is formed at the most area of the top surface of a chip including the top surface of the second electrode 150. The first electrode layer 140 may be formed on a portion or the entire portion of the second electrode 150. The manufacturing process of the second embodiment is identical to that of the first embodiment except for a process of forming the second electrode layer.

Figure 14:
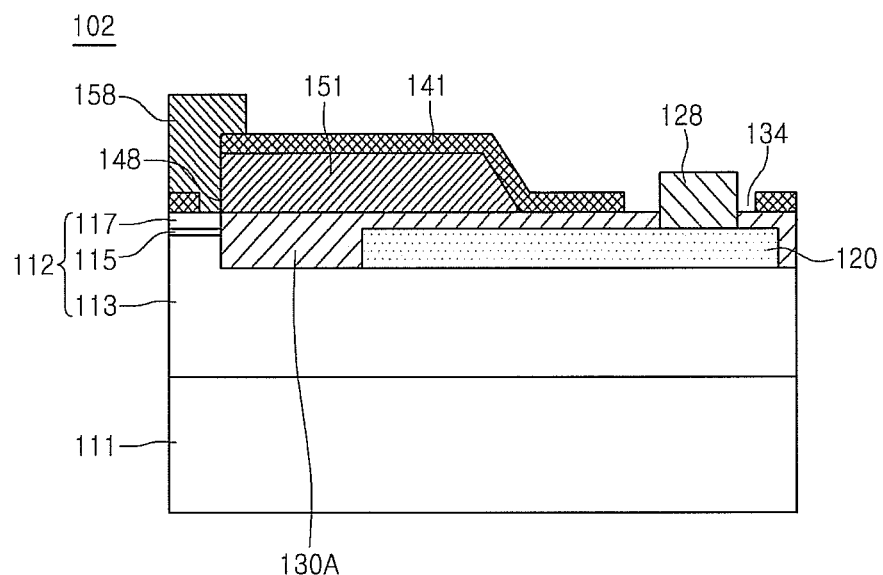
FIG. 14 is a side sectional view showing a light emitting device according to a third embodiment.

FIG. 14 is a side sectional view showing a light emitting device 102 according to the third embodiment. Hereinafter, the third embodiment will be described while focusing on the difference between the first embodiment and the third embodiment in order to avoid redundancy.

Referring to FIG. 14, the light emitting device 102 includes the substrate 111, the first conductive type semiconductor layer 113, the active layer 115, the second conductive type semiconductor layer 117, the first electrode 120, the first pad 128, an insulating layer 130A, a second electrode 151, a first electrode layer 141, and the second pad 158.

The second electrode 151 has an arm shape or a branch structure on the insulating layer 130A, and is vertically overlapped with a portion of the first electrode 120.

The first electrode layer 141 is formed on the second electrode 151, the insulating layer 130A, and the second conductive type semiconductor layer 117. In this case, the second electrode 151 may be formed only on the insulating layer 130A, but the embodiment is not limited thereto.

The second pad 158 is formed in the opening 148 of the first electrode layer 141, and may directly make contact with the second electrode 151, the first electrode layer 141, and the second conductive type semiconductor layer 117. In this case, a portion of the first electrode layer 141 may be provided between the second pad 158 and the second conductive type semiconductor layer 117.

The second electrode 151 may be formed only on the insulating layer 130A, and the second electrode 151 and the first electrode layer 141 can uniformly diffuse current.

Figure 15:
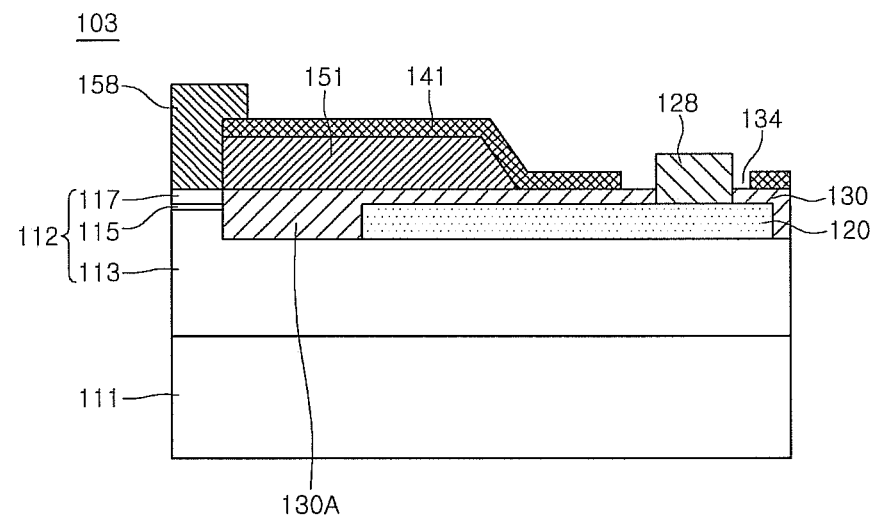
FIG. 15 is a side sectional view showing a light emitting device according to a fourth embodiment.

FIG. 15 is a side sectional view showing a light emitting device 103 according to the fourth embodiment. Hereinafter, the fourth embodiment will be described while focusing on the difference between the first embodiment and the fourth embodiment in order to avoid redundancy.

Referring to FIG. 15, the light emitting device 103 includes the substrate 111, the first conductive type semiconductor layer 113, the active layer 115, the second conductive type semiconductor layer 117, the first electrode 120, the first pad 128, an insulating layer 130A, the second electrode 151, the first electrode layer 141, and the second pad 158.

A lower surface of the second pad 158 may directly contacts with the top surface of the second conductive type semiconductor layer 117. The second pad 158 may directly contacts with the second conductive type semiconductor layer 117 and the second electrode 151.

FIGS. 16A to 16F are plan views showing the manufacturing process of a light emitting device according to a fifth embodiment. Hereinafter, the fourth embodiment will be described while focusing on the difference between the first embodiment and the fifth embodiment in order to avoid redundancy.

Figure 16:
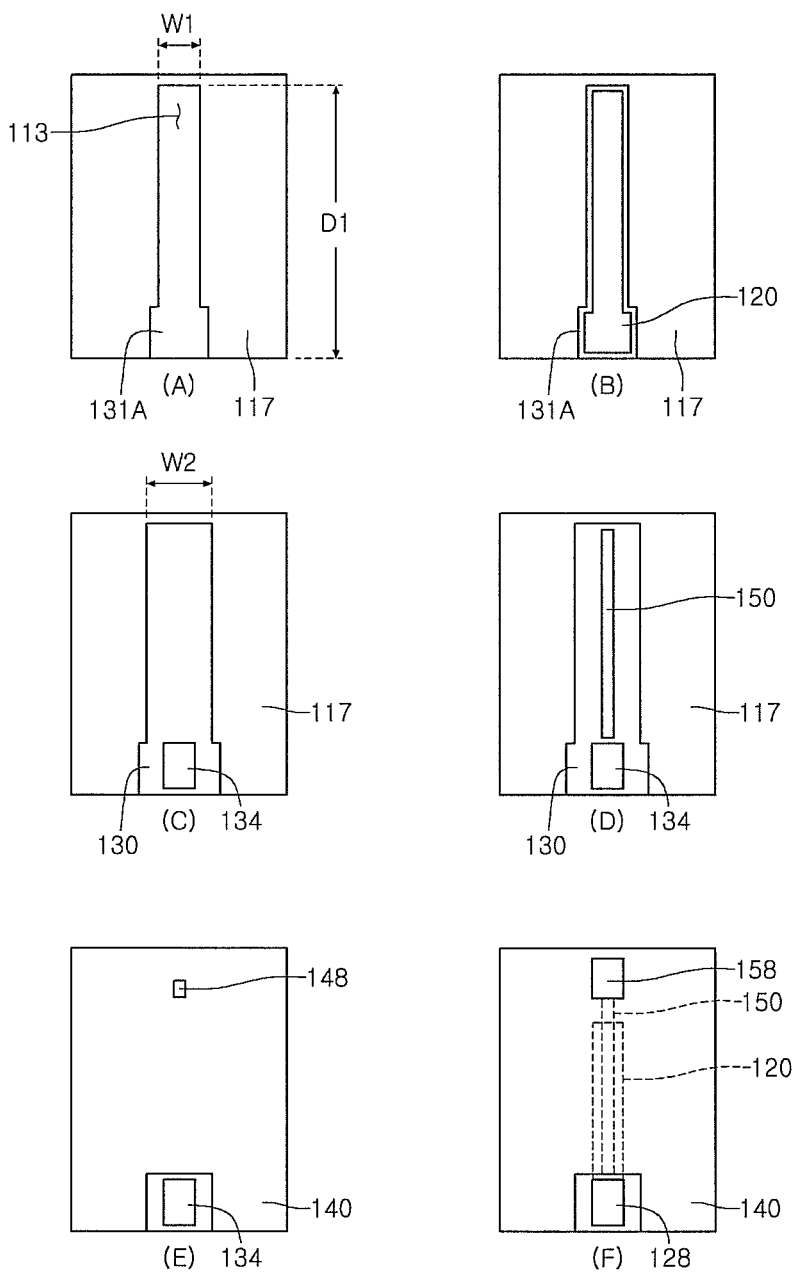
FIGS. 16A to 16F are views showing a light emitting device according to a fifth embodiment.

Referring to FIGS. 16A and 16B, the first conductive type semiconductor layer 113, the active layer, and the second conductive type semiconductor layer 117 are formed on a substrate. Then, a first electrode groove 131A is formed with a predetermined length D1 through a mesa etching process such that the first conductive type semiconductor layer 113 is exposed.

The first electrode groove 131A may be formed toward the center of a chip. The first electrode groove 131A is formed in a line pattern. The width W1 of the first electrode groove 131A is regular or variable, but the embodiment is not limited thereto.

The first electrode 120 is formed along the first electrode groove 131A of the first conductive type semiconductor layer 113. The first electrode 120 is provided inside the first electrode groove 131A.

Referring to FIGS. 16B to 16D, the insulating layer 130 is formed in the first electrode groove 131A to insulate the first electrode 120, and the opening 134 is formed at one side of the insulating layer 130. An upper width W2 of the insulating layer 130 may be identical to or different from a width see (W1 of FIG. 16A) of the first electrode groove 131A, but the embodiment is not limited thereto.

The second electrode 150 having a line shape is formed on the insulating layer 130. The second electrode 150 is vertically overlapped with the first electrode 120 on the insulating layer 130.

Referring to FIGS. 16E to 16F, the first electrode layer 140 is formed on the second electrode 150, the insulating layer 130, and the second conductive type semiconductor layer 117. The first electrode layer 140 may include a transmittive electrode layer or a reflective electrode layer. A plurality of openings 134 and 148 spaced apart from each other are formed in the first electrode layer 140

The first and second pads 128 and 158 are formed in the openings 134 and 148, respectively. The first pad 128 may directly contacts with the first electrode 120, and the second pad 158 may directly contacts with the second electrode 150. According to the embodiment, the stack structure of the first electrode 120/the insulating layer 130/the second electrode 150 is formed, so that light emitting efficiency can be improved. In addition, the stack structure of the second electrode 150/the first electrode layer 140 can prevent the second electrode from being peeled.

FIGS. 17A to 17F are plan views showing the manufacturing process of a light emitting device according to a sixth embodiment. Hereinafter, the fourth embodiment will be described while focusing on the difference between the first embodiment and the sixth embodiment in order to avoid redundancy.

Figure 17:
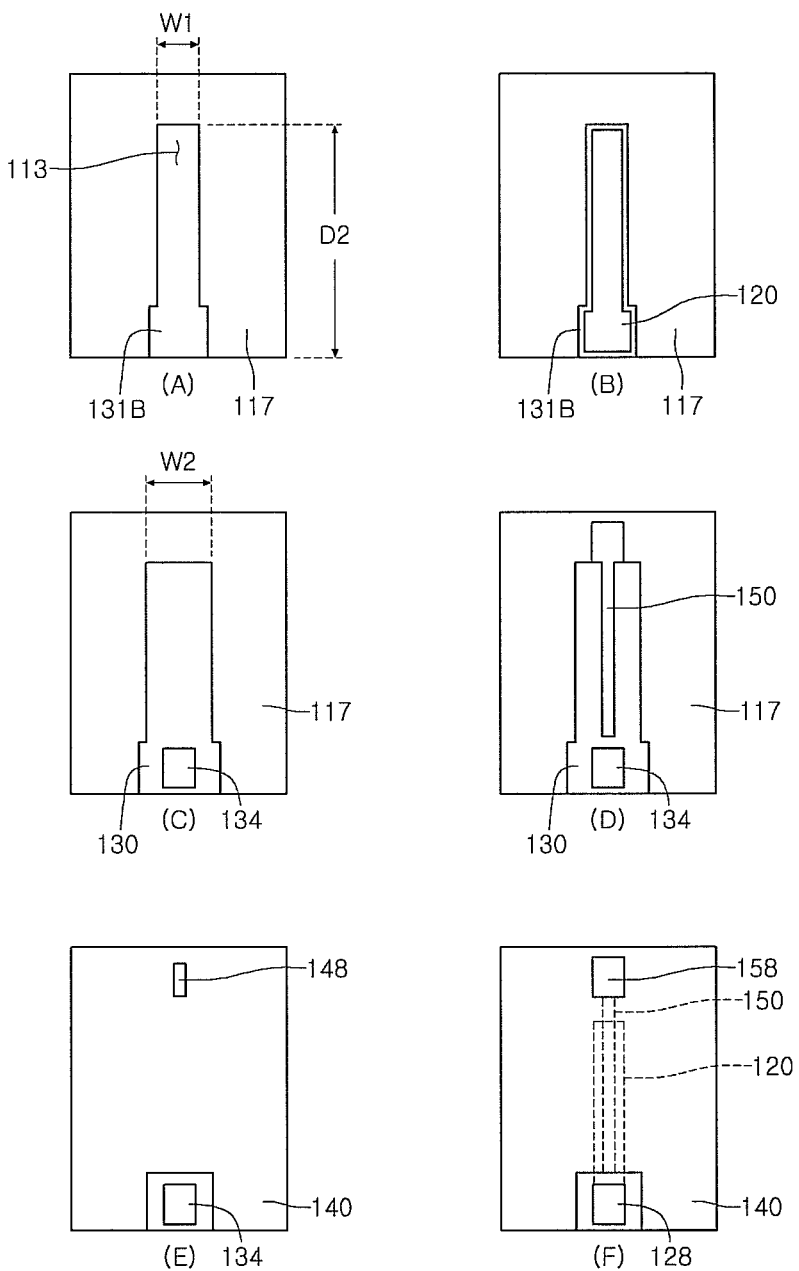
FIGS. 17A to 17F are views showing a light emitting device according to a sixth embodiment.

Referring to FIGS. 17A and 17B, the first conductive type semiconductor layer 113, the active layer, and the second conductive type semiconductor layer 117 are formed on a substrate. Then, a first electrode groove 131B is formed with a predetermined length D2 such that the first conductive type semiconductor layer 113 is exposed.

The first electrode groove 131B may be formed with a predetermined width W1 toward the center of a chip. The first electrode groove 131B is formed in a line pattern. The width W1 of the first electrode groove 131B is regular or variable, but the embodiment is not limited thereto.

The first electrode 120 is formed along the first electrode groove 131B of the first conductive type semiconductor layer 113. The first electrode 120 is provided inside the first electrode groove 131B.

Referring to FIGS. 17B to 17D, the insulating layer 130 is formed in the first electrode groove 131B to insulate the first electrode 120, and the opening 134 is formed at one side of the insulating layer 130. An upper width W2 of the insulating layer 130 may be identical to or different from a width (see W1 of FIG. 17A) of the first electrode groove 131A, but the embodiment is not limited thereto.

The second electrode 150 having a line shape is formed on the insulating layer 130 and the second conductive type semiconductor layer 117. A portion of the second electrode 150 is vertically overlapped with the first electrode 120 on the insulating layer 130.

Referring to FIGS. 17E to 17F, the first electrode layer 140 is formed on the second electrode 150, the insulating layer 130, and the second conductive type semiconductor layer 117. The first electrode layer 140 may include a transmittive electrode layer or a reflective electrode layer. A plurality of openings 134 and 148 are formed in the first electrode layer 140

The first and second pads 128 and 158 are formed in the openings 134 and 148, respectively. The first pad 128 may directly contacts with the first electrode 120, and the second pad 158 may directly contacts with the second electrode 150. According to the embodiment, the first electrode 120/the insulating layer 130/a portion of the second electrode 150 are vertically overlapped with each other, so that light emitting efficiency can be improved. In addition, the stack structure of the second electrode 150/the first electrode layer 140 can prevent the second electrode 150 from being peeled.

FIGS. 18A to 18F are plan views showing the manufacturing process of a light emitting device according to a seventh embodiment. Hereinafter, the seventh embodiment will be described while focusing on the difference between the first embodiment and the seventh embodiment in order to avoid redundancy.

Figure 18:
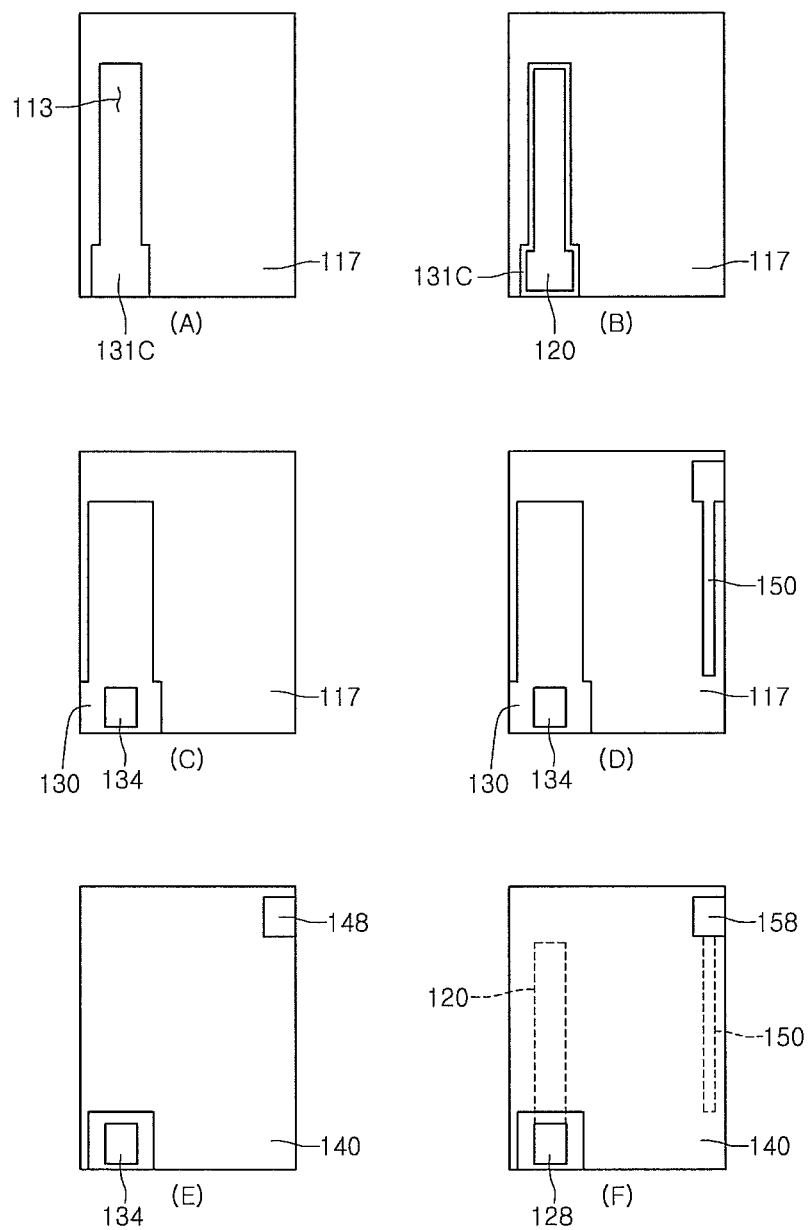
FIGS. 18A to 18F are views showing a light emitting device according to a seventh embodiment.

Referring to FIGS. 18A and 18B, the first conductive type semiconductor layer 113, the active layer, and the second conductive type semiconductor layer 117 are formed on the substrate. A mesa etching process is performed in a length (or width) direction of a chip, thereby forming a first electrode groove 131C having a predetermined length such that the first conductive type semiconductor layer 113 is exposed. The first electrode groove 131C is formed in a line pattern. The width of the first electrode groove 131C is regular or variable, but the embodiment is not limited thereto.

The first electrode 120 is formed along the first electrode groove 131C of the first conductive type semiconductor layer 113. The first electrode 120 is provided inside the first electrode groove 131C.

Referring to FIGS. 18B to 18D, the insulating layer 130 is formed in the first electrode groove 131D to insulate the first electrode 120, and the opening 134 is formed at one side of the insulating layer 130.

The second electrode 150 having a line shape is formed at an opposite side of the second conductive type semiconductor layer 117. The second electrode 150 is offset from the first electrode 120 without being vertically overlapped with the first electrode 120.

Referring to FIGS. 18E to 18F, the first electrode layer 140 is formed on the second electrode 150, the insulating layer 130, and the second conductive type semiconductor layer 117. The first electrode layer 140 may include a transmittive electrode layer or a reflective electrode layer. A plurality of openings 134 and 148 spaced apart from each other are formed in the first electrode layer 140

The first and second pads 128 and 158 are formed in the openings 134 and 148, respectively. The first pad 128 may directly contacts with the first electrode 120, and the second pad 158 may directly contacts with the second electrode 150. According to the embodiment, the first electrode 120 is offset from the second electrode 150, and the stack structure of the second electrode 150/the first electrode layer 140 can prevent the second electrode 150 from being peeled.

FIGS. 19 to 22 are sectional views schematically showing the manufacturing process of a light emitting device according to an eighth embodiment. Hereinafter, the eighth embodiment will be described while focusing on the difference between the first embodiment and the eighth embodiment in order to avoid redundancy.

Figure 19:
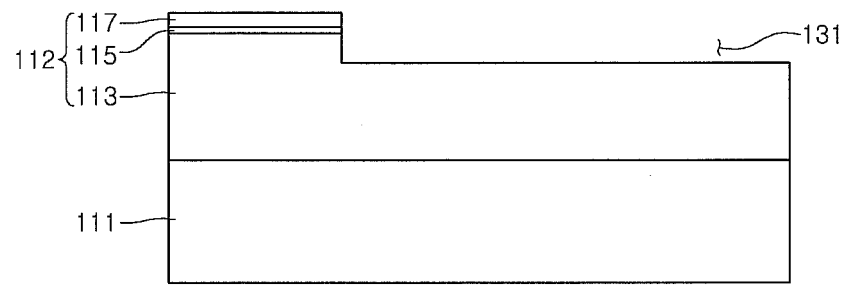
FIGS. 19 to 22 are side sectional views showing a process of forming a first electrode according to an eighth embodiment.
Figure 20:
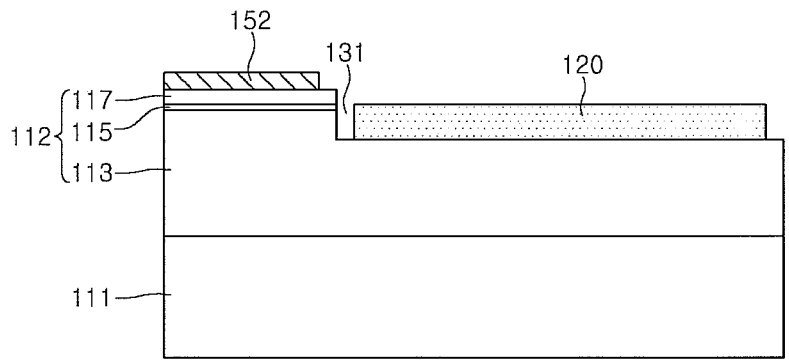

Referring to FIGS. 19 and 20, after forming the first conductive type semiconductor layer 113, the active layer 115, and the second conductive type semiconductor layer 117 on the substrate 111, the first electrode groove 131 is formed to expose a portion of the first conductive type semiconductor layer 113. The first electrode 120 is formed inside the first electrode groove 131, and the second electrode 152 is formed on the second conductive type semiconductor layer 117. In other words, the first and second electrodes 120 and 152 may be formed through the same process. In this case, a mask layer is formed on the entire region except for regions for the first and second electrodes to prevent a short phenomenon, but the embodiment is not limited thereto.

Figure 21:
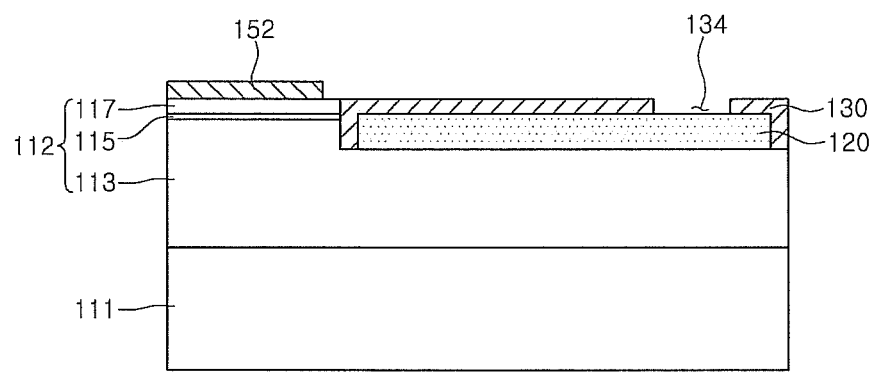
Figure 22:
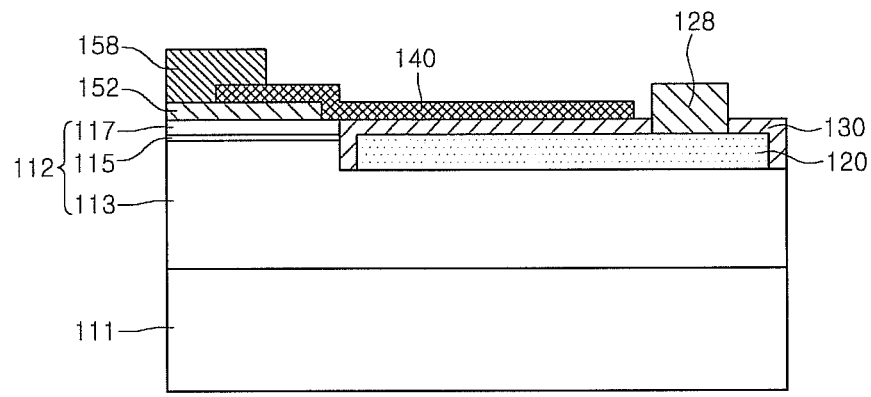

Referring to FIGS. 21 and 22, the insulating layer 130 is formed around the first electrode 120, and the opening 131 is exposed. The first electrode layer 140 is formed on the second electrode 152, the insulating layer 130, and the second conductive type semiconductor layer 117.

FIGS. 23 to 26 are sectional views schematically showing the manufacturing process of a light emitting device according to a ninth embodiment. Hereinafter, the ninth embodiment will be described while focusing on the difference between the first embodiment and the ninth embodiment in order to avoid redundancy.

Figure 23:
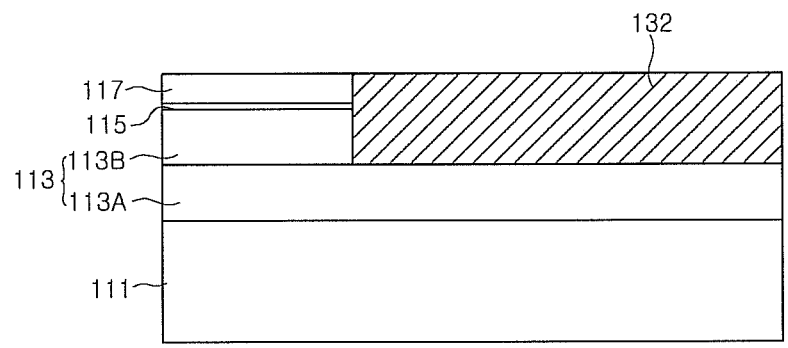
FIGS. 23 to 26 are side sectional views showing a process of forming a first electrode according to a ninth embodiment.
Figure 24:
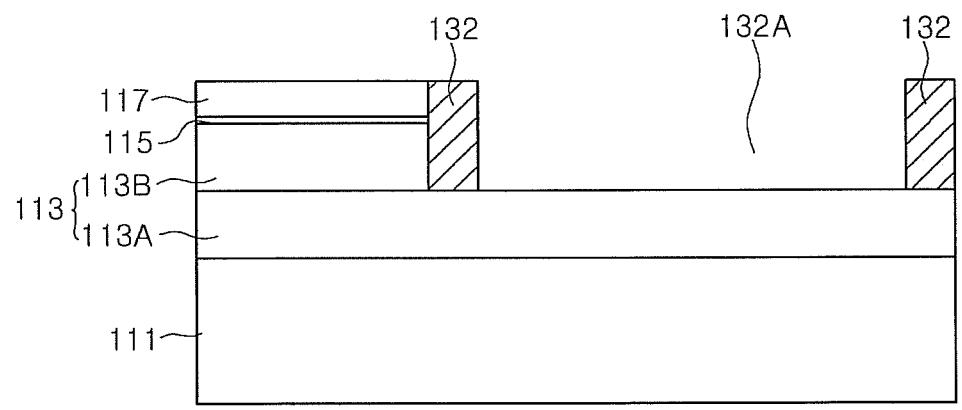

Referring to FIGS. 23 and 24, an insulating layer 132 is formed on a lower layer 113A of the first conductive type semiconductor layer 113 on the substrate 111. The insulating layer 132 has a shape corresponding to a first electrode pattern, and has a width greater than a line with of the first electrode pattern.

Thereafter, an upper layer 113B, the active layer 115, and the second conductive type semiconductor layer 117 are formed on the lower layer 113A of the first conductive type semiconductor layer 113. The lower layer 113A and the upper layer 113B include III-V group compound semiconductors and include a first conductive dopant.

Figure 25:
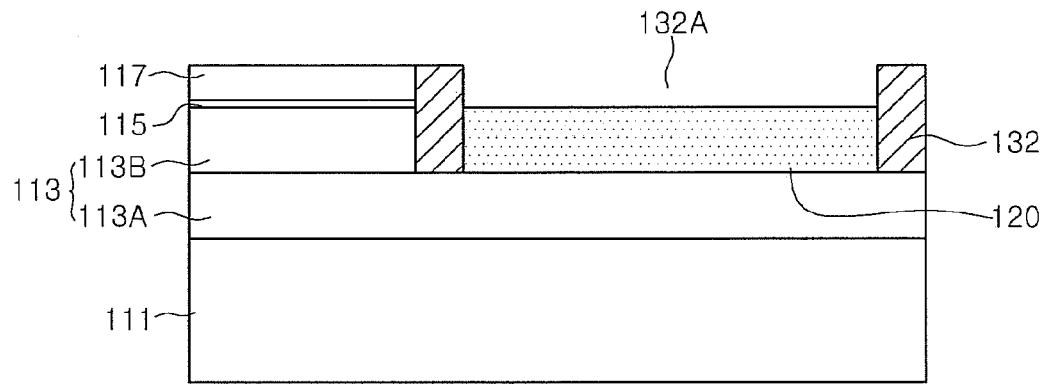

Referring to FIGS. 24 and 25, the first electrode groove 132A is formed by etching an inner part (i.e., first electrode region) of the insulating layer 132 with a depth to expose the lower layer 113A of the first conductive type semiconductor layer 113. The first electrode 120 is formed in the first electrode groove 132A with a predetermined depth, and the insulating layer 132 is provided at the outer side surface of the first electrode 120. The first electrode 120 can be embedded in the first electrode groove 132A.

Figure 26:
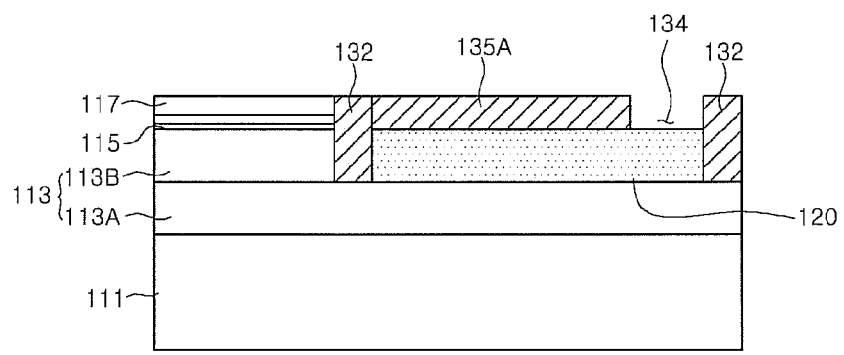

Referring to FIGS. 25 and 26, the insulating layer 135A is formed on the top surface of the first electrode 120. The insulating layer 135A may be formed in a remaining region except for the opening 134. The first pad may be formed in the opening 134. Since process of forming the second electrode/the first electrode layer/the second pad has been described in the first embodiment, the details thereof will be omitted.

FIGS. 27 to 30 are sectional views schematically showing a process of forming the first electrode according to a tenth embodiment. Hereinafter, the tenth embodiment will be described while focusing on the difference between the first embodiment and the tenth embodiment in order to avoid redundancy.

Figure 27:
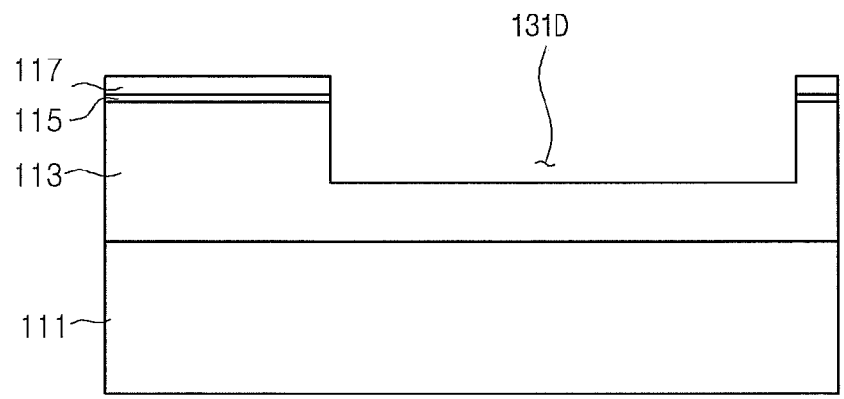
FIGS. 27 to 30 are side sectional views showing a process of forming a first electrode according to a tenth embodiment.
Figure 28:
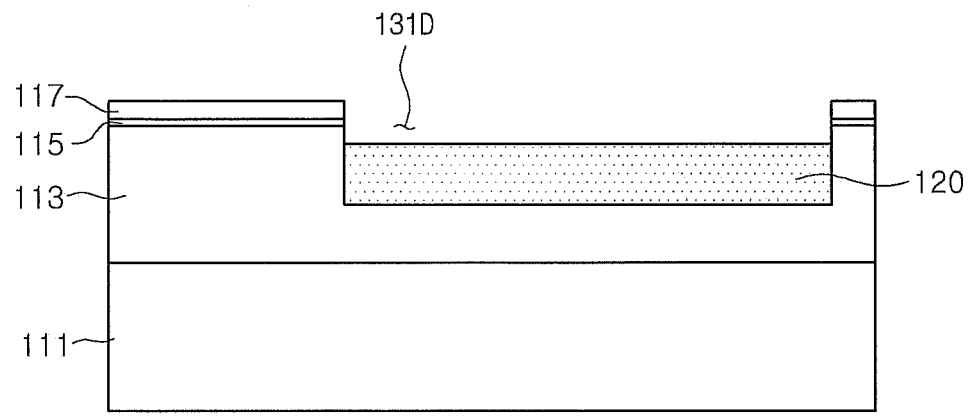

Referring to FIGS. 27 and 28, the first conductive type semiconductor layer 113, the active layer 115, and the second conductive type semiconductor layer 117 are formed on the substrate 111, and the first electrode groove 131D is formed through a mesa etching process. In this case, the first electrode groove 131D may be formed deeper than that of the first embodiment.

Figure 29:
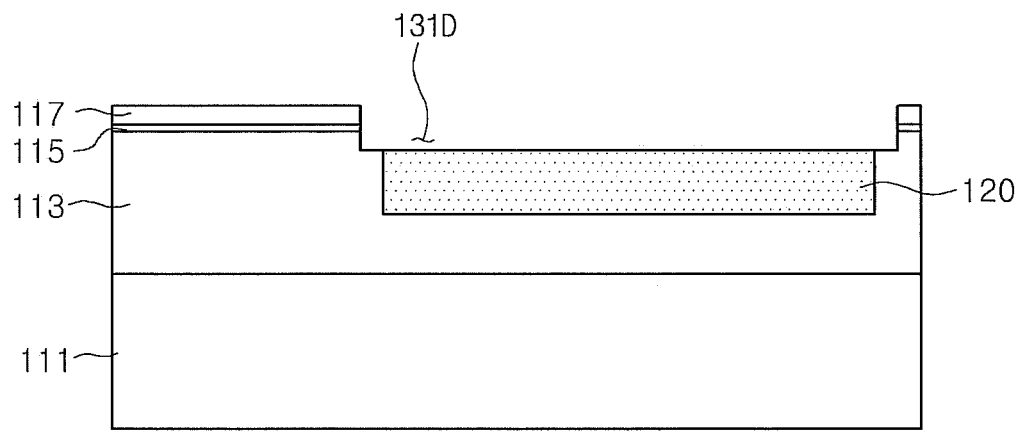
Figure 30:
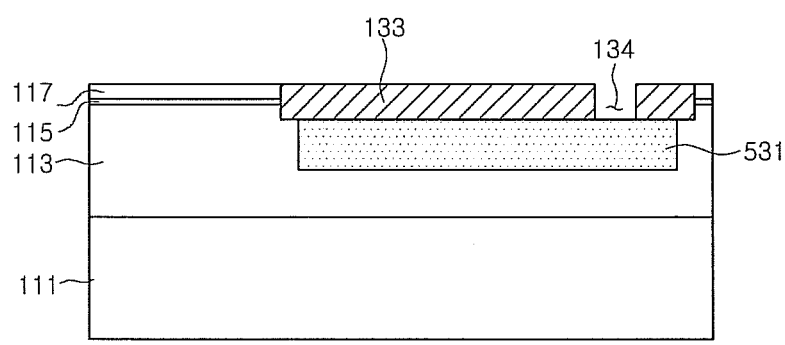

Referring to FIGS. 29 and 30, the first electrode 120 is formed in the opening 134, and a top surface of the first electrode 120 may be lower than a lower surface of the active layer 115. Accordingly, the electrical contact between the first electrode 120 and the active layer 115 can be prevented.

After the first electrode 120 has been formed, the semiconductor layers 113, 115, and 117 surrounding the first electrode 120 are etched, and the insulating layer 133 is formed in the etched region. The opening 134 may be formed in the insulating layer 133.

The first pad may be formed in the opening 134. Since the process of forming the second electrode/the first electrode layer/the second pad has been described in the first embodiment, the details thereof will be omitted.

FIGS. 31 to 34 are views showing examples of patterns of the first and second electrodes.

Figure 31:
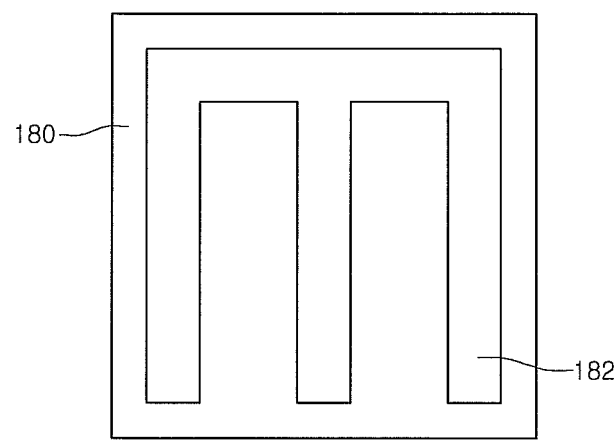
FIGS. 31 to 34 are views showing examples of electrode patterns according to the embodiment.

Referring to FIG. 31, an electrode pattern 182 having a plurality of arm shapes may be formed on a semiconductor layer 180. The semiconductor layer may be the first conductive type semiconductor layer, the second conductive type semiconductor layer, or the insulating layer. The electrode pattern 182 may be bent at least one time.

Figure 32:
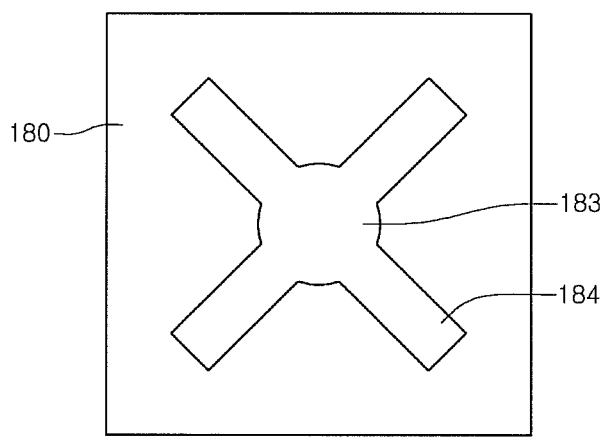

Referring to FIG. 32, an electrode 183 and an electrode pattern having a star-shape structure are formed on the semiconductor layer 180.

Figure 33:
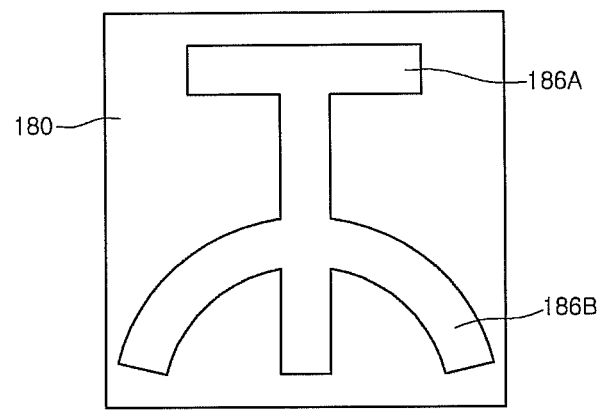

Referring to FIG. 33, an electrode 186A is arranged in a line shape, and may include a plurality of arm shapes 186B branching from the center of the line.

Figure 34:
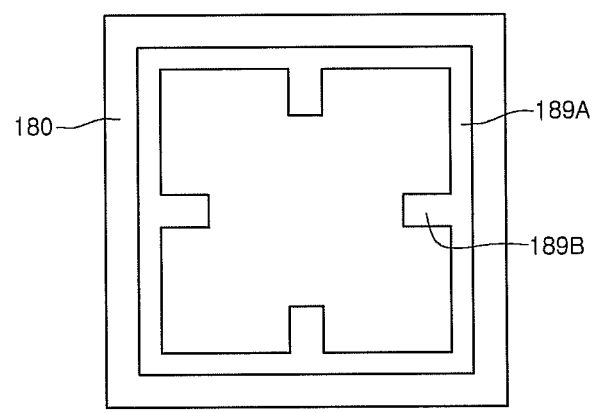

Referring to FIG. 34, an electrode 189A has a polygonal shape and may include branch structures 189B extending inside the electrode 189A.

As shown in FIGS. 31 to 34, the freedom degree of the first and second electrodes can be improved, and a pad may be formed at a portion of each pattern.

According to the embodiments, a light emitting area can be improved, and current can be diffused, so that light emitting efficiency can be improved. In addition, a device having strong ESD (Electro Static Discharge) resistance can be manufactured due to the current diffusion. According to the embodiment, the sequence of processes for the insulating layer and the first electrode, the depth of mesa-etching, and electrode patterns can be variously changed in the technical scope of the embodiments. The patterns of the first and second electrodes may be partially overlapped with each other in at least one region.

According to the embodiment, the second electrode can be prevented from being peeled by using the structure of the second electrode/the first electrode and the dual electrode structure.

Figure 35:
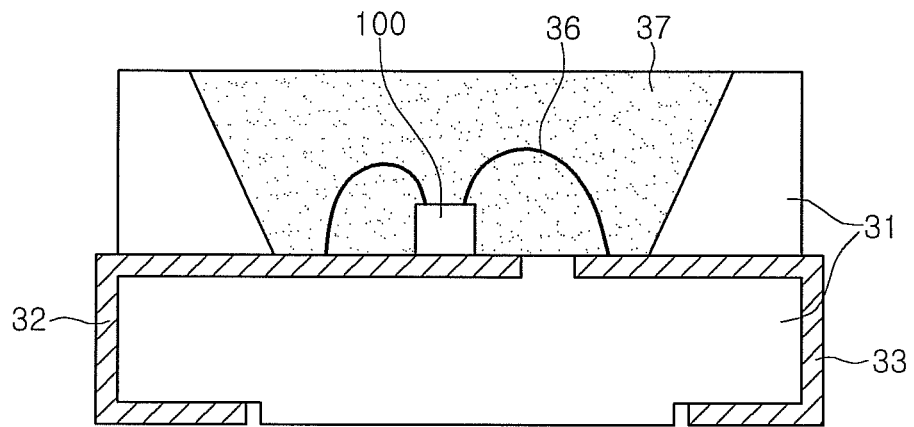
FIG. 35 is a side sectional view showing a light emitting device package according to the embodiment.

FIG. 35 is a side sectional view showing a light emitting device package 30 based on FIG. 1. Hereinafter, details thereof will be made based on the structure of the light emitting device.

Referring to FIG. 35, the light emitting device package 30 includes a body 31, first and second lead electrodes 32 and 33 disposed on the body 31, the light emitting device 100 according to the embodiment installed in the body 31 and electrically connected with the first and second lead electrodes 32 and 33, and a molding member 37 surrounding the light emitting device 100.

The body 31 may include a silicon, synthetic resin like as PPA, or metallic material. An inclined surface may be formed around the light emitting device 100. The body 31 may have a cavity structure, an upper portion of which is open. The light emitting device 100 can be provided in the cavity.

The first and second lead electrodes 32 and 33 are insulated from each other, and supply power to the light emitting device 100. The first and second lead electrodes 32 and 33 reflect light emitted from the light emitting device 100 such that light efficiency can be increased. The first and second lead electrodes 32 and 33 can discharge heat from the light emitting device 100 to the outside.

The light emitting device 100 may be installed on the body 31, or on the first lead electrode 32 or the second lead electrode 33.

The light emitting device 100 may be electrically connected with the first and second lead electrodes 32 and 33 through a wire 36. According to the embodiment, instead of the light emitting device 100, the light emitting devices according to other embodiments disclosed above can be employed. The light emitting devices can be mounted through at least one of wires, die-bonding or flip-bonding, but the embodiment is not limited thereto.

The molding member 37 can protect the light emitting device 100 by surrounding the light emitting device 100. The molding member 37 includes a phosphor to change the wavelength of light emitted from the light emitting device 100. A lens may be formed on the molding member 37.

The light emitting device 100 according to the embodiment (embodiments) is packaged on a semiconductor substrate including resin or silicon, an insulating substrate, or a ceramic substrate, so that the semiconductor light emitting device 100 serves as a light source for an indication device, an illumination device, a display device, and the like. Each embodiment can be selectively adapted to another embodiment.

The light emitting device or the light emitting device package according to the embodiment can be adapted to an illumination system. The illumination system includes an illumination unit shown in FIG. 36, and a backlight unit shown in FIG. 37. The illumination system may be included in a traffic light, a head lamp, or a signboard lamp.

Figure 36:
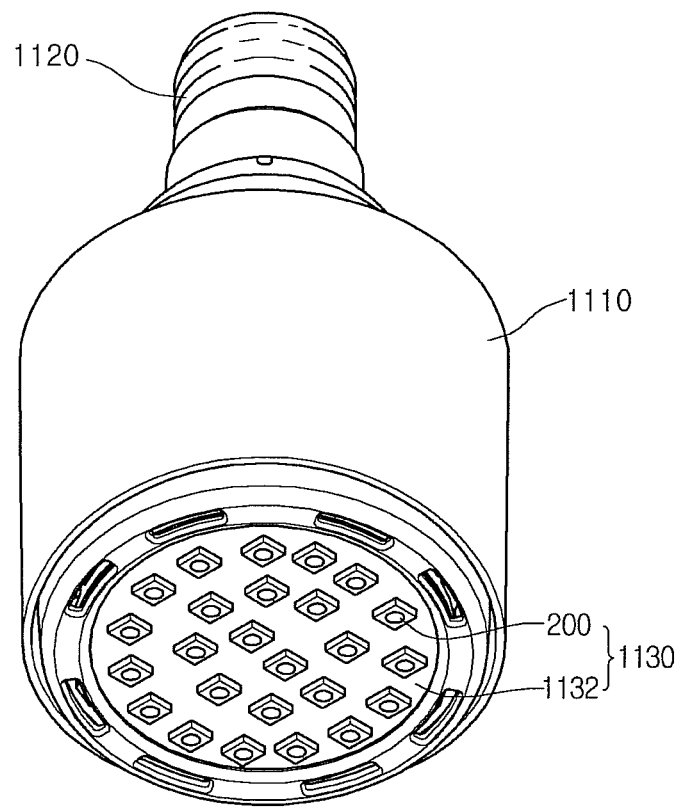
FIG. 36 is a view showing an illumination unit according to the embodiment.

FIG. 36 is a perspective view showing an illumination unit according to the embodiment.

Referring to FIG. 36, the illumination unit 1100 includes a case body 1110, a light emitting module 1130 installed in the case body 1110, and a connector 1120 installed in the case body 1110 to receive power from an external power supply.

Preferably, the case body 1110 may include a material having a superior heat sink characteristic, and may include a metallic material or a resin material.

The light emitting module 1130 may include a board 1132 and at least one light emitting device package 1210 mounted on the board 1132. The light emitting device package 1210 may include a light emitting device according to the embodiment.

The board 1132 may be formed by printing a circuit pattern on an insulator. For example, the board 1132 may include a printed circuit board (PCB), a metal core PCB, a flexible PCB, or a ceramic PCB.

The board 1132 may include a material to effectively reflect light. The surface of the board 1132 may have a color, such as white or silver, to effectively reflect light.

At least one light emitting device package 1210 may be mounted on the board 1132. The light emitting device package 1210 may include at least one light emitting device. The LED 100 may include a light emitting diode of the visible ray band to emit red, green, blue, or white light or an UV light emitting diode to emit ultraviolet ray.

The light emitting module 1130 may have the combination of various light emitting device packages 1210 in order to obtain desirable color and brightness. For example, the light emitting module 1130 may have the combination of white, red, and green light emitting diodes in order to ensure a high color rendering index (CRI).

The connector 1120 is electrically connected with the light emitting module 1130 to supply power to the light emitting module 1130. The connector 1120 is coupled with an external power supply through a socket scheme, but the embodiment is not limited thereto. For example, the connector 1120 has the form of a pin so that the connector 1120 is inserted into the external power supply or connected with the external power supply by using a wire.

Figure 37:
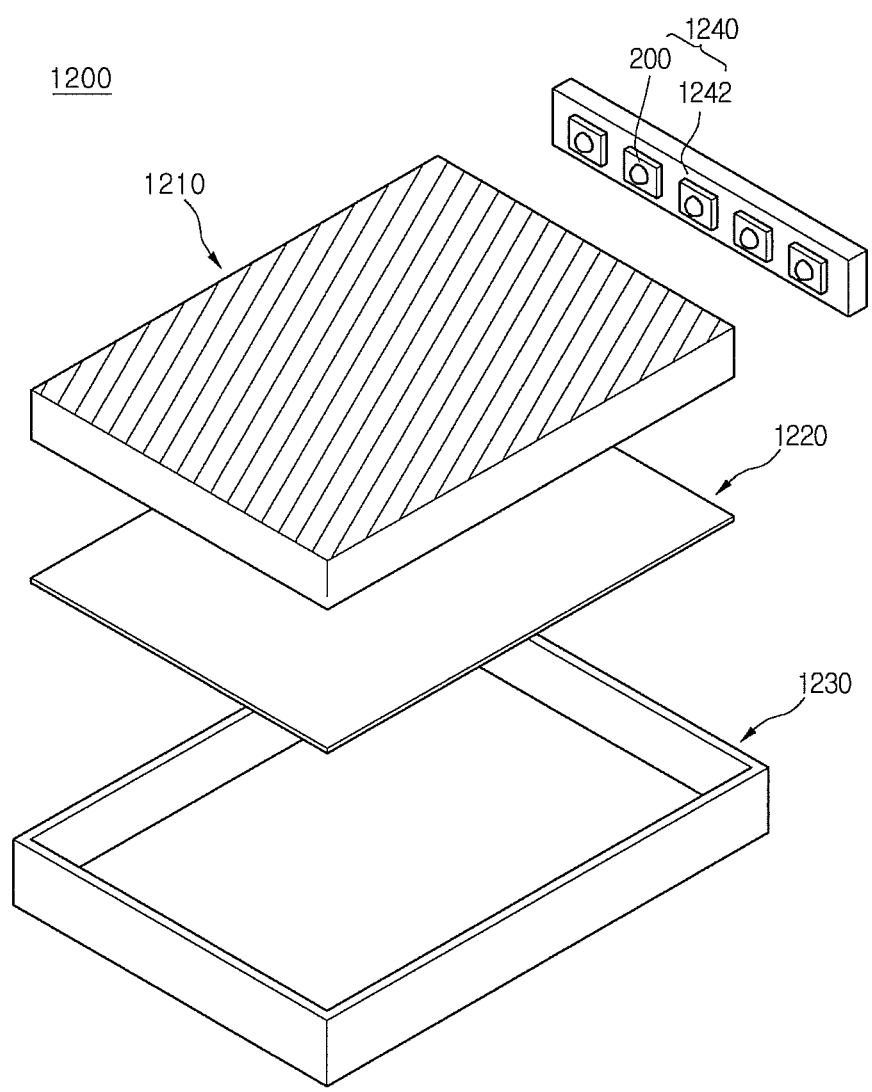
FIG. 37 is a view showing a backlight unit according to the embodiment.

FIG. 37 is an exploded perspective view showing a backlight unit 1200 according to the embodiment.

Referring to FIG. 37, the backlight unit 1200 includes a light guide plate 1210, a light emitting module 1240 to supply light to the light guide plate 1210, a reflective member 1220 provided under the light guide plate 1210, and a bottom cover 1230 to receive the light guide plate 1210, the light emitting module 1240, and the reflective member 1220.

The light guide plate 1210 diffuses light to serve as a surface light source. The light guide plate 1210 includes a transparent material. For example, the light guide plate 1210 includes one of acrylic resin-based material such as polymethyl methacrylate (PMMA), polyethylene terephthalate (PET), poly carbonate (PC), cycloolefin copolymer (COC), and polyethylene naphthalate (PEN).

The light emitting module 1240 supplies light to at least one side of the light guide plate 1210, and serves as a light source of a display apparatus having the backlight unit.

The light emitting module 1240 may make contact with the light guide plate 1210, but the embodiment is not limited thereto. In detail, the light emitting module 1240 includes a board 1242 and a plurality of light emitting packages 200 mounted on the board 1242, and the board 1242 may make contact with the light guide plate 1210, but the embodiment is not limited thereto.

The board 1242 may be a printed circuit board (PCB) including a circuit pattern (not shown). The board 1242 may include a metal core PCB and a flexible PCB as well as a typical PCB, but the embodiment is not limited thereto.

The light emitting device packages 200 may be mounted on the board 1242 such that a light emission surface of each light emitting device package 200 is spaced apart from the light guide plate 1210 with a predetermined distance.

The reflective member 1220 may be formed below the light guide plate 1210. The reflective member 1220 upwardly reflects light which has been incident downward from the light guide plate 1210, thereby improving the brightness of a backlight unit. The reflective member 1220 may include PET, PC, or PVC resin, but the embodiment is not limited thereto.

The bottom cover 1230 may receive the light guide plate 1210, the light emitting module 1240, and the reflective member 1220. To this end, the bottom cover 1230 has the shape of a box, a top surface of which is open, but the embodiment is not limited thereto.

The bottom cover 1230 may include a metallic material or a resin material, and may be manufactured through press molding or extrusion molding.

The method of manufacturing the light emitting device according to the embodiment includes forming the first conductive type semiconductor layer, forming the active layer on the first conductive type semiconductor layer, forming the second conductive type semiconductor layer on the active layer, forming the first electrode on the first conductive type semiconductor layer through mesa-etching, forming the insulating layer on the first electrode, forming the second electrode on at least one layer of the insulating layer and the second conductive type semiconductor layer, and forming the first electrode layer on the second electrode and the second conductive type semiconductor layer.

According to the embodiment, a light emitting area can be more improved as compared with a light emitting device of the same chip size, and the pattern arrangement of the first and second electrodes can be freely performed. In addition, current is diffused on the active layer, so that light emitting efficiency can be improved. The first electrode layer is provided on the second electrode having an arm shape or a branch structure, so that the area of the first electrode layer can be increased, thereby improving current diffusion. The first electrode layer is provided on the second electrode, so that the second electrode can be prevented from being peeled.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A light emitting device comprising:
    a substrate;
    a light emitting structure on the substrate, the light emitting structure including a first conductive type semiconductor layer, an active layer on the first conductive type semiconductor layer, and a second conductive type semiconductor layer on the active layer;
    an opening portion disposed in the light emitting structure;
    a first electrode disposed in the opening portion and contacted with a portion of the first conductive type semiconductor layer;
    an insulating layer covering the first electrode;
    a second electrode on the insulating layer and connected to a portion of the second conductive type semiconductor layer; and
    a first electrode layer between the second electrode and the second conductive type semiconductor layer,
    wherein the first conductive type semiconductor layer includes a first sidewall and a second sidewall opposite to the first sidewall,
    wherein the opening portion includes a first opening adjacent to the first sidewall and a second opening adjacent to the second sidewall,
    wherein a width of the first opening is greater than a width of the second opening.

2. The light emitting device of claim 1, wherein a portion of the second electrode is vertically overlapped with the first electrode.

3. The light emitting device of claim 1, further comprising a second electrode layer on a top surface of the insulating layer.

4. The light emitting device claim 3, wherein the second electrode layer is vertically overlapped with the first electrode.

5. The light emitting device of claim 4, wherein the second electrode layer and the second electrode directly contact the top surface of the insulating layer.

6. The light emitting device of claim 1, further comprising a second pad connected to the second electrode.

7. The light emitting device of claim 6, wherein a portion of the first electrode layer is interposed between the second electrode and the second pad.

8. The light emitting device of claim 7, wherein the second pad directly contacts with the second electrode, the first electrode layer, and the second conductive type semiconductor layer.

9. The light emitting device of claim 1, further comprising a first pad on the first electrode.

10. The light emitting device of claim 8, wherein the first electrode is embedded in the light emitting structure.

11. A light emitting device comprising:
a substrate;
a light emitting structure on the substrate, the light emitting structure including a first conductive type semiconductor layer, an active layer on the first conductive type semiconductor layer, and a second conductive type semiconductor layer on the active layer;
an opening portion disposed in the light emitting structure;
a first electrode disposed in the opening portion and contacted with a portion of the first conductive type semiconductor layer;
an insulating layer covering the first electrode;
a second electrode on the insulating layer and connected to the second conductive type semiconductor layer; and
a first electrode layer including a reflective electrode layer between the second electrode and the second conductive type semiconductor layer,
wherein the first conductive type semiconductor layer includes a first sidewall and a second sidewall opposite to the first sidewall,
wherein the opening portion is disposed in the first conductive type semiconductor layer,
wherein the opening portion includes a first opening adjacent to the first sidewall and a second opening adjacent to the second sidewall,
wherein the second opening is extended more closely to the second sidewall than to the first sidewall toward a center direction of the first conductive type semiconductor layer.

12. The light emitting device of claim 11, wherein a first portion of the second electrode is offset from the first electrode.

13. The light emitting device of claim 11, wherein at least one of the first and second electrodes includes at least one of a straight-line pattern, a curved pattern, a mixture pattern of the straight-line pattern and the curved pattern, plural patterns branching from one pattern, a polygonal shape pattern, a lattice shape pattern, a dot shape pattern, a diamond shape pattern, a parallelogram shape pattern, a mesh shape pattern, a stripe shape pattern, a cross shape pattern, a star-shape pattern, a circular shape pattern, and a mixture pattern thereof.

14. The light emitting device of claim 11, wherein the first and second electrodes are vertically overlapped with each other by at least 60%.

15. The light emitting device of claim 11, further comprising a second electrode layer on a top surface of the insulating layer.

16. The light emitting device claim 15, wherein the second electrode layer is vertically overlapped with the first electrode.

17. The light emitting device of claim 16, wherein the second electrode layer and the second electrode directly contact the top surface of the insulating layer.

18. The light emitting device of claim 11, further comprising a second pad connected to the second electrode.

19. The light emitting device of claim 18, wherein a portion of the first electrode layer is interposed between the second electrode and the second pad.

20. A light emitting device package comprising:
a body;
a plurality of lead electrodes on the body;
a light emitting device electrically connected to the lead electrodes; and
a molding member covering the light emitting device,
wherein the light emitting device includes a substrate; a light emitting structure on the substrate, the light emitting structure including a first conductive type semiconductor layer, an active layer on the first conductive type semiconductor layer, and a second conductive type semiconductor layer on the active layer; an opening portion disposed in the light emitting structure; a first electrode disposed in the opening portion and contacted with a portion of the first conductive type semiconductor layer; an insulating layer covering the first electrode; a second electrode on the insulating layer and connected to a portion of the second conductive type semiconductor layer; and a first electrode layer between the second electrode and the second conductive type semiconductor layer,
wherein the first conductive type semiconductor layer includes a first sidewall and a second sidewall opposite to the first sidewall,
wherein the opening portion includes a first opening adjacent to the first sidewall and a second opening adjacent to the second sidewall,
wherein a width of the first opening is greater than a width of the second opening.

* * * * *